US012588199B2

(12) United States Patent
Choi et al.

(10) Patent No.: US 12,588,199 B2
(45) Date of Patent: Mar. 24, 2026

(54) NON-VOLATILE MEMORY DEVICE AND ELECTRONIC SYSTEM INCLUDING THE SAME

(71) Applicant: SAMSUNG ELECTRONICS CO., LTD., Suwon-si (KR)

(72) Inventors: Dae-Hun Choi, Hwaseong-si (KR); Jae Chul Lee, Hwaseong-si (KR); Byung-Sun Park, Suwon-si (KR); Seung Jae Sim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 701 days.

(21) Appl. No.: 17/930,956

(22) Filed: Sep. 9, 2022

(65) Prior Publication Data

US 2023/0240072 A1 Jul. 27, 2023

(30) Foreign Application Priority Data

Jan. 21, 2022 (KR) ........................ 10-2022-0008921

(51) Int. Cl.
H10B 43/27 (2023.01)
G11C 5/06 (2006.01)
(Continued)

(52) U.S. Cl.
CPC .............. H10B 43/27 (2023.02); G11C 5/06 (2013.01); G11C 16/0483 (2013.01); (Continued)

(58) Field of Classification Search
CPC ........ H10B 43/27; H10B 43/10; H10B 43/35; H10B 43/40; H10B 43/50; G11C 5/06; G11C 16/0483; H01L 23/5386
See application file for complete search history.

(56) References Cited

U.S. PATENT DOCUMENTS 8,765,598 B2 * 7/2014 Smith ............... H01L 21/76816
257/773
8,828,884 B2 * 9/2014 Lee ........................ H10B 12/20
438/242
(Continued)

FOREIGN PATENT DOCUMENTS

KR 20210079087 A 6/2021

*Primary Examiner* — Yara B Green
*Assistant Examiner* — Benjamin Michael Kupp
(74) *Attorney, Agent, or Firm* — Wolf, Greenfield & Sacks, P.C.

(57) ABSTRACT

A non-volatile memory device includes a substrate having a cell array region and an extension region. A mold structure includes a plurality of gate electrodes and a plurality of mold insulating layers alternately stacked on the substrate such that the mold structure has a step shape that steps downwardly in the extension region in a direction away from the cell array region. A channel structure penetrates through the mold structure in the cell array region, and a cell contact structure penetrates through the mold structure in the extension region. A portion of the cell contact structure is in contact with a portion of an uppermost one of the gate electrodes. The cell contact structure includes a first portion in contact with a side surface of the uppermost one of the gate electrodes and a second portion in contact with a top surface of the uppermost one of the gate electrodes. A width of the first portion is smaller than a width of the second portion.

19 Claims, 27 Drawing Sheets

(51) Int. Cl.
    *G11C 16/04*           (2006.01)
    *H10B 43/10*           (2023.01)
    *H10B 43/35*           (2023.01)
    *H10B 43/40*           (2023.01)

(52) U.S. Cl.
    CPC ............. *H10B 43/10* (2023.02); *H10B 43/35* (2023.02); *H10B 43/40* (2023.02)

(56)            References Cited

U.S. PATENT DOCUMENTS

| | | |
|---|---|---|
| 10,192,928 B2 | 1/2019 | Fukuda et al. |
| 10,381,362 B1 | 8/2019 | Cui et al. |
| 10,580,881 B2 * | 3/2020 | Bao ...................... H10D 30/025 |
| 10,892,267 B2 | 1/2021 | Mushiga et al. |
| 10,930,585 B2 | 2/2021 | Smith et al. |
| 11,195,842 B2 * | 12/2021 | Leobandung .......... H10B 41/27 |
| 11,296,021 B2 * | 4/2022 | Lee ........................ H10B 43/35 |
| 2020/0350249 A1 | 11/2020 | Kim et al. |
| 2021/0098367 A1 | 4/2021 | Lee |
| 2021/0118902 A1 | 4/2021 | Kanamori et al. |
| 2021/0193672 A1 | 6/2021 | Kim et al. |

* cited by examiner

NON-VOLATILE MEMORY DEVICE AND ELECTRONIC SYSTEM INCLUDING THE SAME

CROSS-REFERENCE TO RELATED APPLICATION

This application claims priority from Korean Patent Application No. 10-2022-0008921 filed on Jan. 21, 2022 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a non-volatile memory device and an electronic system including the same.

2. Description of the Related Art

In order to satisfy the excellent performance and low price of non-volatile memory devices demanded by consumers, it may be required to increase the degree of integration of non-volatile memory devices. Since the degree of integration of non-volatile memory devices may be an important factor in determining the price of a product, an increased degree of integration may be required for the non-volatile memory devices.

Meanwhile, since the degree of integration of two-dimensional or planar non-volatile memory devices is mainly determined by an area occupied by a unit memory cell, the two-dimensional or planar non-volatile memory devices may be affected by the level of technology for forming a fine pattern. However, since ultra-expensive equipment may be required to form the fine pattern, the degree of integration of the two-dimensional non-volatile memory devices is increasing, but is still limited. Accordingly, three-dimensional non-volatile memory devices including memory cells arranged three-dimensionally have been proposed.

SUMMARY

Aspects of the present disclosure provide a non-volatile memory device capable of improving performance and reliability of an element.

Aspects of the present disclosure provide an electronic system capable of improving performance and reliability of an element.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a non-volatile memory device comprising, a substrate comprising a cell array region and an extension region, a mold structure comprising a plurality of gate electrodes and a plurality of mold insulating layers alternately stacked on the substrate, wherein the mold structure has a step shape that steps downwardly in the extension region in a direction away from the cell array region, a channel structure penetrating through the mold structure in the cell array region, and a cell contact structure penetrating through the mold structure in the extension region, wherein the cell contact structure is in contact with a portion of an uppermost one of the gate electrodes, wherein the cell contact structure comprises a first portion in contact with a side surface of the gate electrode and a second portion in contact with a top surface of the uppermost one of the gate electrodes, and a width of the first portion is smaller than a width of the second portion.

According to another aspect of the present disclosure, there is provided a non-volatile memory device comprising, a substrate comprising a cell array region and an extension region, a mold structure including a plurality of gate electrodes and a plurality of mold insulating layers alternately stacked on the substrate, wherein the mold structure has a step shape that steps downwardly in the extension region in a direction away from the cell array region, first and second interlayer insulating layers sequentially stacked on the mold structure, a channel structure penetrating through the mold structure in the cell array region, a cell contact structure penetrating through the mold structure and the first interlayer insulating layer in the extension region, wherein the cell contact structure is in contact with a side surface of an uppermost one of the gate electrodes, a top surface of the gate electrode, and a side surface of the first interlayer insulating layer, and an insulating ring between the cell contact structure and another one of the gate electrodes and extending around the cell contact structure, wherein the cell contact structure comprises a first surface in contact with the side surface of the uppermost one of the gate electrodes and a second surface in contact with the side surface of the interlayer insulating layer, wherein a width of the cell contact structure having the first surface in contact with the side surface of the uppermost one of the gate electrodes is smaller than a width of the cell contact structure having the second surface in contact with the side surface of the first interlayer insulating layer, and wherein an etch rate of the first interlayer insulating layer is greater than an etch rate of the second interlayer insulating layer.

According to another aspect of the present disclosure, there is provided an electronic system comprising, a main board, a non-volatile memory device on the main board, and a controller electrically connected to the non-volatile memory device, wherein the non-volatile memory device includes, a substrate comprising a cell array region and an extension region, a mold structure including a plurality of gate electrodes and a plurality of mold insulating layers alternately stacked on the substrate, wherein the mold structure has a step shape that steps downwardly in the extension region in a direction away from the cell array region, a channel structure penetrating through the mold structure in the cell array region, and a cell contact structure penetrating through the mold structure in the extension region, wherein the cell contact structure is in contact with a portion of an uppermost one of the gate electrodes, wherein the cell contact structure comprises a first portion in contact with a side surface of the uppermost one of the gate electrodes and a second portion in contact with a top surface of the uppermost one of the gate electrodes, and wherein a width of the first portion is smaller than a width of the second portion.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

Hereinafter, a non-volatile memory device according to example embodiments will be described with reference to FIGS. 1 to 15.

Figure 1:
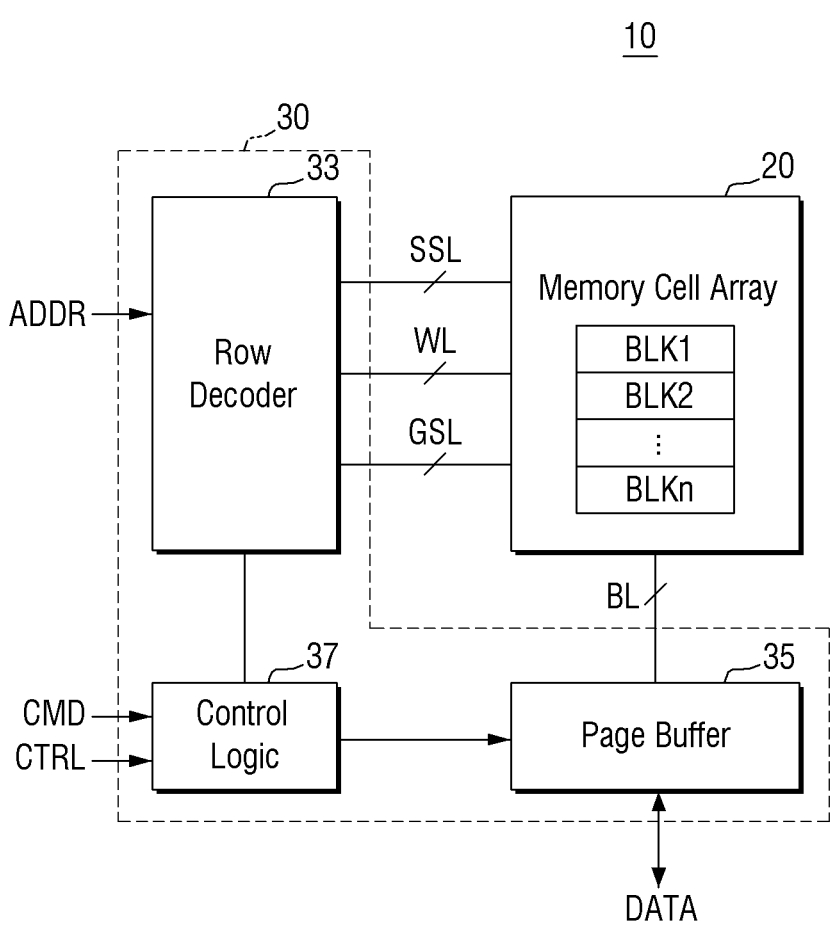
FIG. 1 is an example block diagram for describing a non-volatile memory device according to some example embodiments.

FIG. 1 is an example block diagram for describing a non-volatile memory device according to some example embodiments.

Referring to FIG. 1, a non-volatile memory device 10 according to some example embodiments includes a memory cell array 20 and a peripheral circuit 30.

The memory cell array 20 may include a plurality of memory cell blocks BLK1 to BLKn. Each of the memory cell blocks BLK1 to BLKn may include a plurality of memory cells. The memory cell array 20 may be connected to the peripheral circuit 30 through a bit line BL, a word line WL, at least one string select line SSL, and at least one ground select line GSL. Specifically, the memory cell blocks BLK1 to BLKn may be connected to a row decoder 33 through the word line WL, the string select line SSL, and the ground select line GSL. In addition, the memory cell blocks BLK1 to BLKn may be connected to a page buffer 35 through the bit line BL.

The peripheral circuit 30 may receive an address ADDR, a command CMD, and a control signal CTRL from the outside of the non-volatile memory device 10, and may transmit and receive data DATA to and from an external device of the non-volatile memory device 10. The peripheral circuit 30 may include a control logic 37, a row decoder 33, and a page buffer 35. Although not illustrated, the peripheral circuit 30 may further include various sub-circuits such as an input/output circuit, a voltage generating circuit for generating various voltages necessary for an operation of the non-volatile memory device 10, and an error correction circuit for correcting an error in data DATA read from the memory cell array 20.

The control logic 37 may be connected to the row decoder 33, the input/output circuit, and the voltage generating circuit. The control logic 37 may control an overall operation of the non-volatile memory device 10. The control logic 37 may generate a variety of internal control signals used in the non-volatile memory device 10 in response to the control signal CTRL. For example, the control logic 37 may adjust a voltage level provided to the word line WL and the bit line BL when a memory operation such as a program operation or an erase operation is performed.

The row decoder 33 may select at least one of the plurality of memory cell blocks BLK1 to BLKn in response to the address ADDR, and may select at least one word line WL, at least one string select line SSL, and at least one ground select line GSL of the selected memory cell blocks BLK1 to BLKn. In addition, the row decoder 33 may transfer a voltage for performing a memory operation to the word line WL of the selected memory cell blocks BLK1 to BLKn.

The page buffer 35 may be connected to the memory cell array 20 through the bit line BL. The page buffer 35 may operate as a writer driver or a sense amplifier. Specifically, when performing a program operation, the page buffer 35 operates as the writer driver to apply a voltage according to the data DATA to be stored in the memory cell array 20 to the bit line BL. Meanwhile, when performing a read operation, the page buffer 35 may operate as the sense amplifier to sense the data DATA stored in the memory cell array 20.

Figure 2:
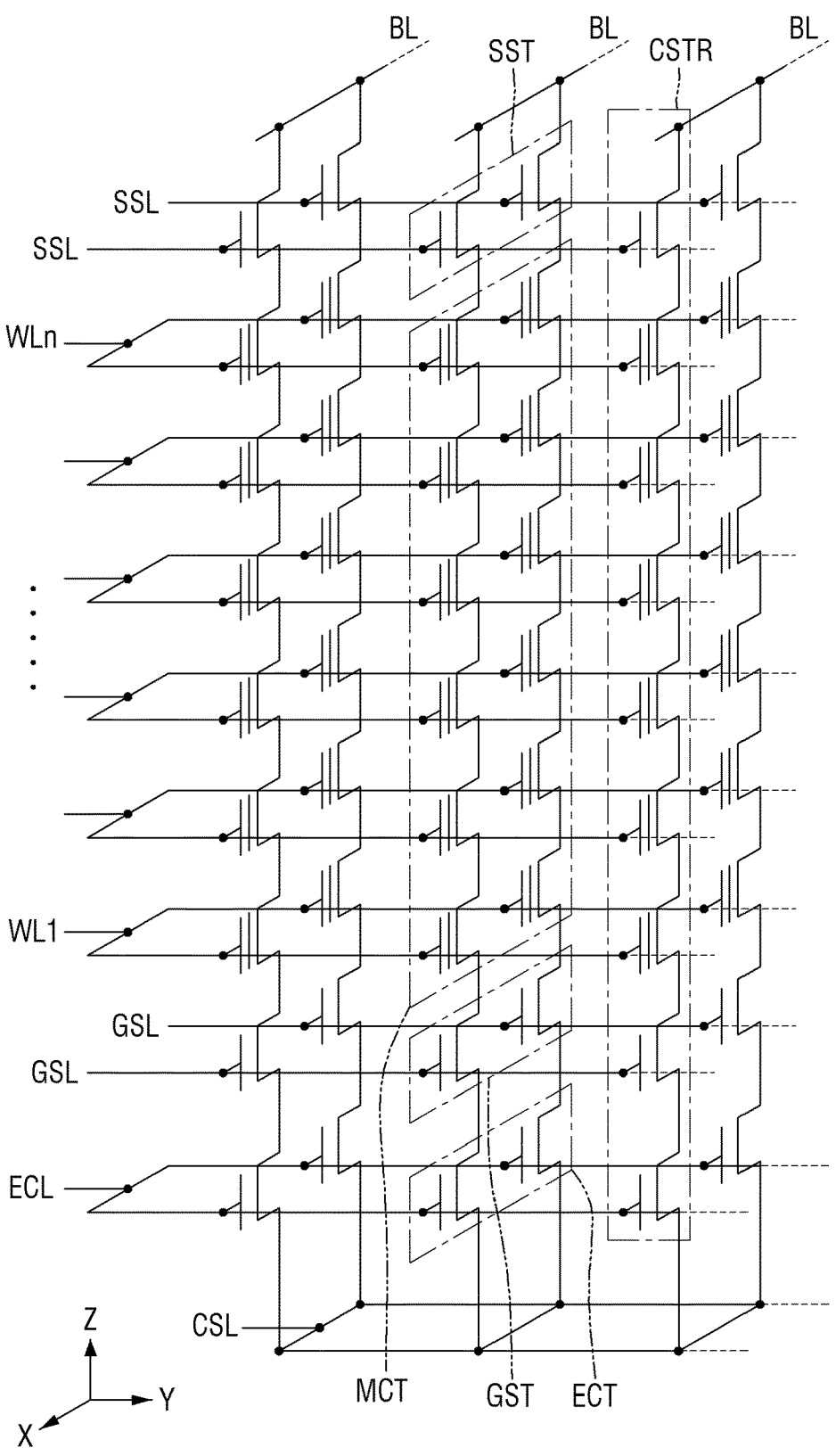
FIG. 2 is an example circuit diagram for describing a non-volatile memory device according to some example embodiments.

FIG. 2 is an example circuit diagram for describing a non-volatile memory device according to some example embodiments.

Referring to FIG. 2, the memory cell array (e.g., 20 in FIG. 1) of the non-volatile memory device according to some example embodiments includes a common source line CSL, a plurality of bit lines BL, and a plurality of cell strings CSTR.

The common source line CSL may extend in a first direction X. In some example embodiments, the plurality of common source lines CSL may be two-dimensionally arranged. For example, the plurality of common source lines CSL may be spaced apart from each other and extend in the first direction X, respectively. The common source lines CSL may be electrically applied with the same voltage, or may be applied with different voltages to be separately controlled.

The plurality of bit lines BL may be two-dimensionally arranged. For example, the bit lines BL may be spaced apart from each other and extend in a second direction Y crossing the first direction X, respectively. A plurality of cell strings CSTR may be connected in parallel to each of the bit lines BL. The cell strings CSTR may be commonly connected to the common source line CSL. That is, the plurality of cell strings CSTR may be disposed between the bit lines BL and the common source line CSL.

Each of the cell strings CSTR may include a ground select transistor GST connected to the common source line CSL, a string select transistor SST connected to the bit line BL, and a plurality of memory cell transistors MCT disposed between the ground select transistor GST and the string select transistor SST. Each of the memory cell transistors MCT may include a data storage element. The ground select transistor GST, the string select transistor SST, and the memory cell transistors MCT may be connected in series.

The common source line CSL may be commonly connected to sources of the ground select transistors GST. In addition, the ground select line GSL, a plurality of word lines WL1 to WLn, and the string select line SSL may be disposed between the common source line CSL and the bit line BL. The ground select line GSL may be used as a gate electrode of the ground select transistor GST, the word lines WL1 to WLn may be used as gate electrodes of the memory cell transistors MCT, and the string select line SSL may be used as a gate electrode of the string select transistor SST.

In some example embodiments, an erase control transistor ECT may be disposed between the common source line CSL and the ground select transistor GST. The common source line CSL may be commonly connected to sources of the erase control transistors ECT. In addition, an erase control line ECL may be disposed between the common source line CSL and the ground select line GSL. The erase control line ECL may be used as a gate electrode of the erase control transistor ECT. The erase control transistors ECT may generate a gate induced drain leakage (GIDL) to perform an erase operation of the memory cell array.

Figure 3:
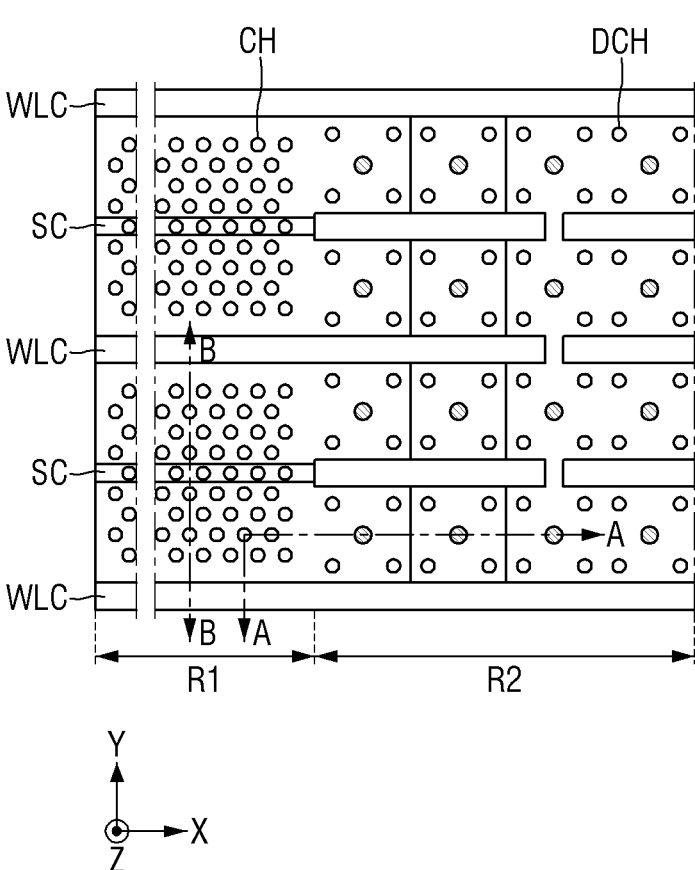
FIG. 3 is an example layout diagram for describing a non-volatile memory device according to some example embodiments.
Figure 4:
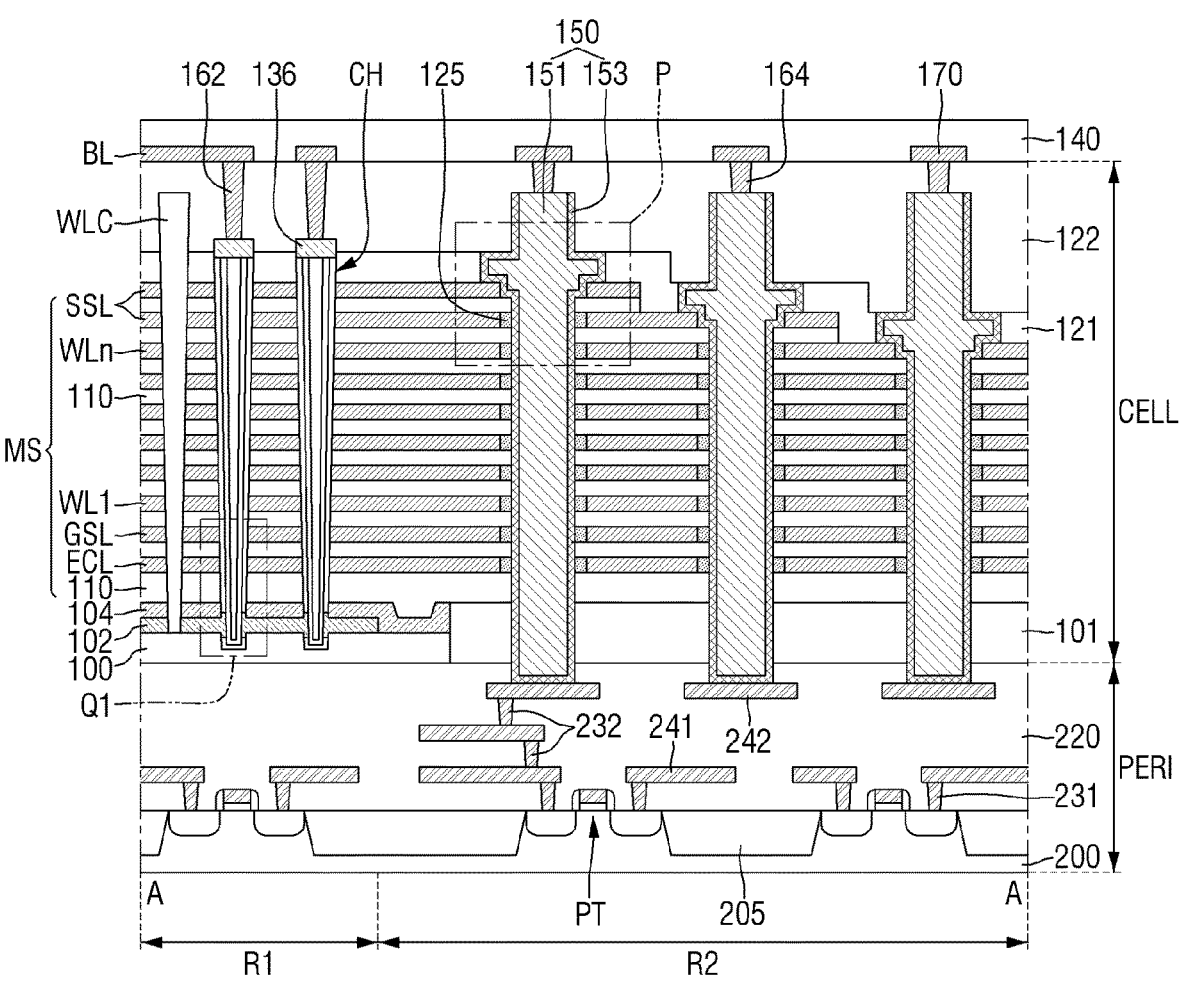
FIG. 4 is a cross-sectional view taken along line A-A of FIG. 3.
Figure 5:
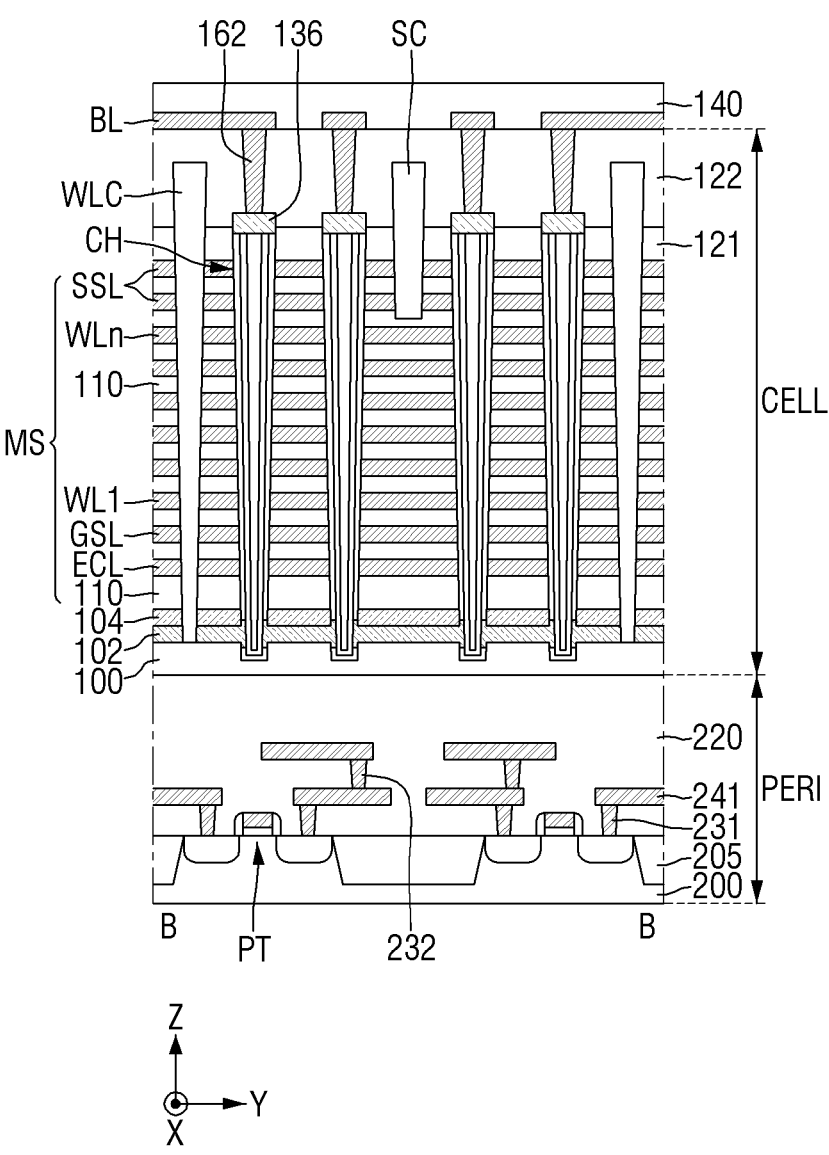
FIG. 5 is a cross-sectional view taken along line B-B of FIG. 3.
Figure 6:
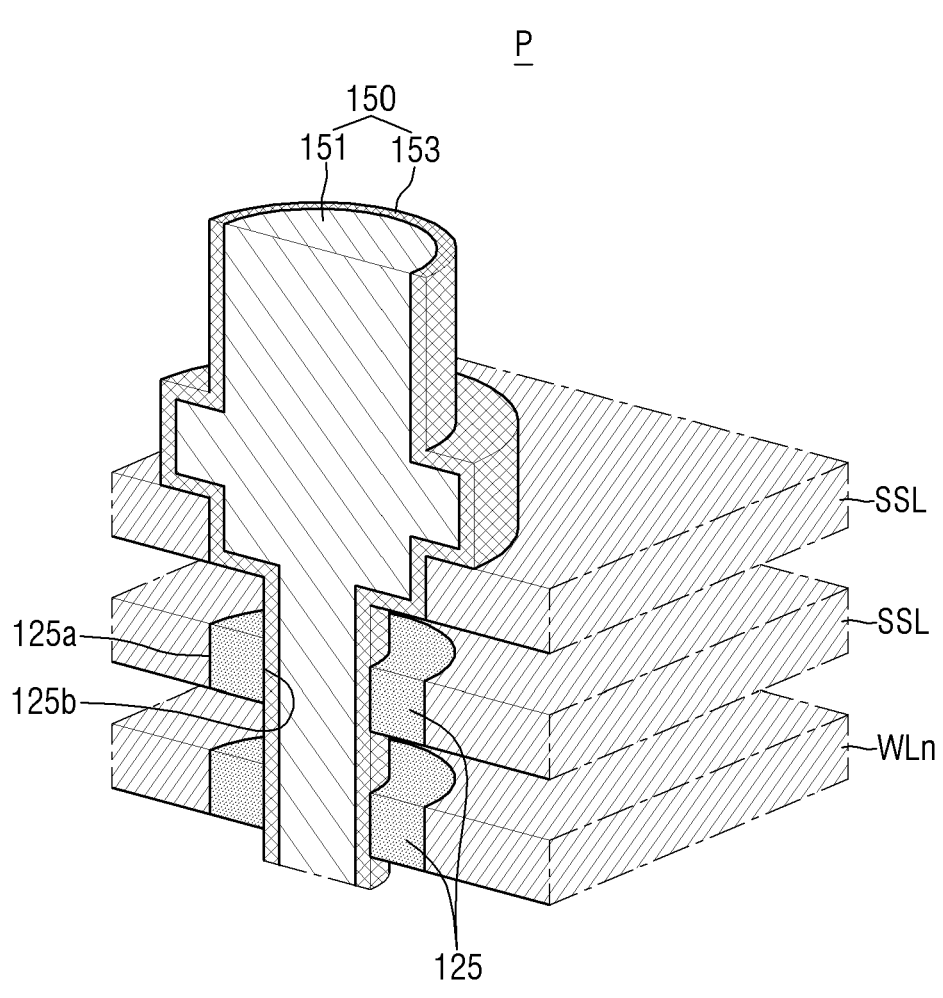
FIG. 6 is an enlarged perspective view for describing a region P of FIG. 4.
Figure 7:
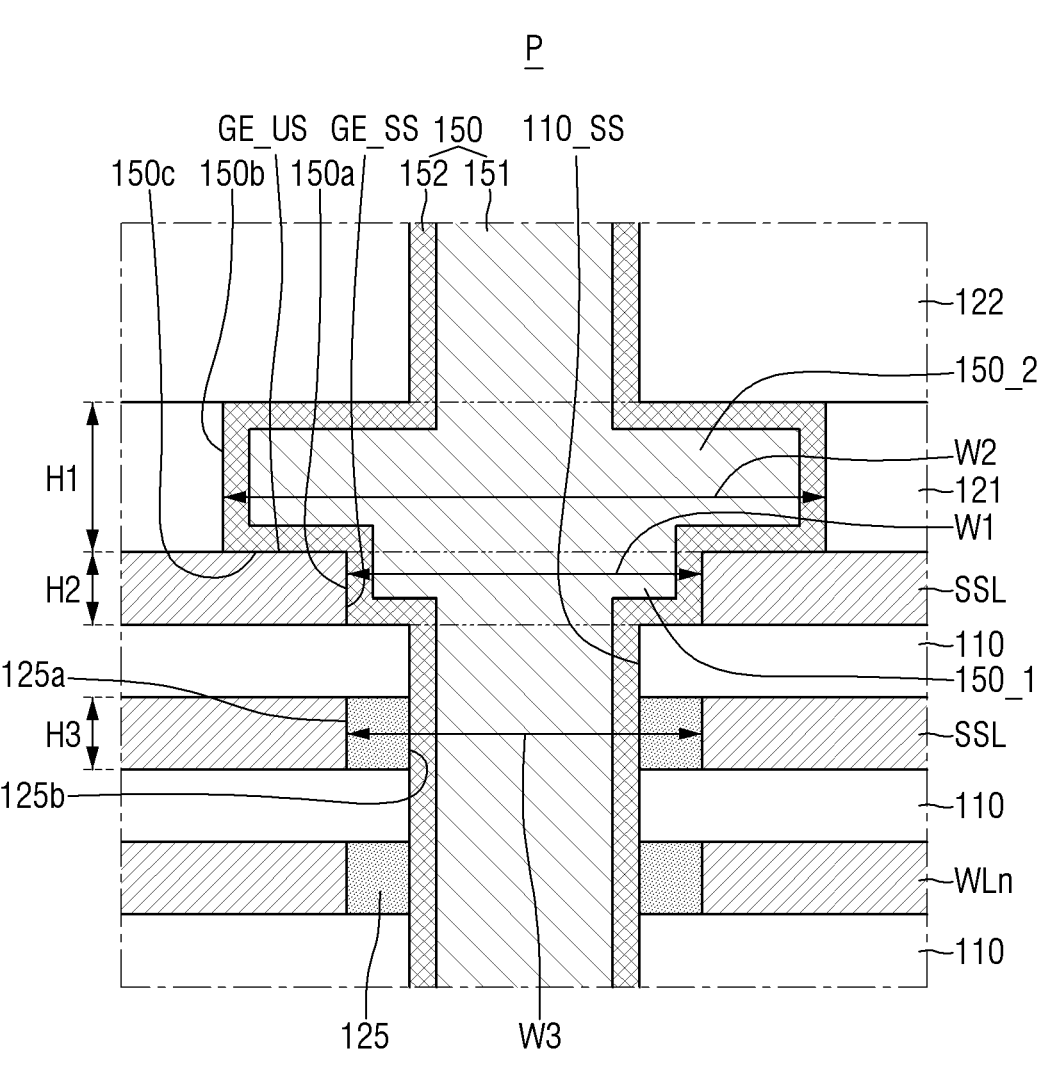
FIG. 7 is an enlarged cross-sectional view for describing the region P of FIG. 4.
Figure 8:
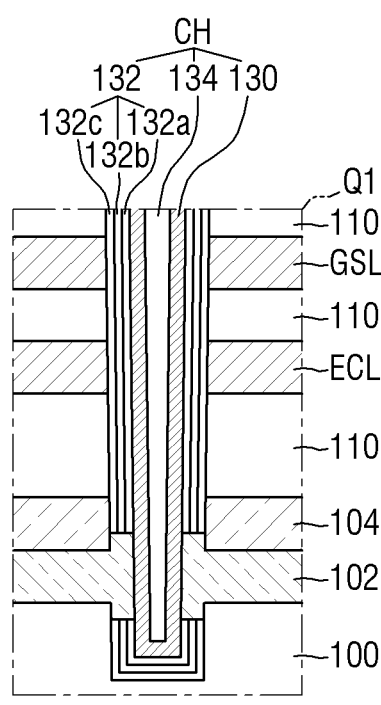
FIG. 8 is an enlarged cross-sectional view for describing a region Q1 of FIG. 4.

FIG. 3 is an example layout diagram for describing a non-volatile memory device according to some example embodiments. FIG. 4 is a cross-sectional view taken along line A-A of FIG. 3. FIG. 5 is a cross-sectional view taken along line B-B of FIG. 3. FIG. 6 is an enlarged perspective view for describing a region P of FIG. 4. FIG. 7 is an enlarged cross-sectional view for describing the region P of FIG. 4. FIG. 8 is an enlarged cross-sectional view for describing a region Q1 of FIG. 4.

Referring to FIGS. 3 to 8, a non-volatile memory device according to some example embodiments includes a memory cell region CELL and a peripheral circuit region PERI.

The memory cell region CELL may include a cell substrate 100, an insulating substrate 101, a mold structure MS, a first interlayer insulating layer 121, a second interlayer insulating layer 122, a channel structure CH, a block isolation region WLC, a bit line BL, a cell contact structure 150, an insulating ring 125, a first wiring structure 170, and a first inter-wiring insulating layer 140.

The substrate may include a cell array region R1 and an extension region R2. The substrate may include, but is not limited to, the cell substrate 100 and the insulating substrate 101.

The cell substrate 100 may include, for example, a semiconductor substrate such as a silicon substrate, a germanium substrate, or a silicon-germanium substrate. Alternatively, the cell substrate 100 may include a silicon-on-insulator (SOI) substrate or a germanium-on-insulator (GOI) substrate. In some example embodiments, the cell substrate 100 may include impurities. For example, the cell substrate 100 may include n-type impurities (e.g., phosphorus (P), arsenic (As), etc.).

The memory cell array (e.g., 20 in FIG. 1) including the plurality of memory cells may be provided in the cell array region R1. For example, a channel structure CH, a bit line BL, and gate electrodes ECL, GSL, WL1 to WLn, and SSL, which will be described later, may be disposed in the cell array region R1. In the following description, a surface of the cell substrate 100 on which the memory cell array is disposed may be referred to as a front side of the cell substrate 100. Conversely, a surface of the cell substrate 100 opposite to the front side of the cell substrate 100 may be referred to as a back side of the cell substrate 100.

The extension region R2 may be disposed around the cell array region R1. Gate electrodes ECL, GSL, WL1 to WLn, and SSL, which will be described later, may be stacked in a step shape in the extension region R2, as illustrated in FIG. 4. Mold insulating layers 110, which will be described later, may be stacked in a step shape in the extension region R2, as illustrated in FIG. 4.

The insulating substrate 101 may be provided in the extension region R2. The insulating substrate 101 may include, for example, at least one of silicon oxide, silicon nitride, silicon oxynitride, and silicon carbide, but is not limited thereto. Unlike illustrated, the insulating substrate 101 may be provided in the cell substrate 100.

Although it is illustrated that a bottom surface of the insulating substrate 101 is coplanar with a bottom surface of the cell substrate 100, this is only an example. As another example, the bottom surface of the insulating substrate 101 may be lower than the bottom surface of the cell substrate 100.

The mold structure MS may be provided on the front side (e.g., the top surface) of the cell substrate 100. The mold structure MS may include a plurality of gate electrodes ECL, GSL, WL1 to WLn, and SSL and a plurality of mold insulating layers 110 that are alternately stacked on the cell substrate 100, as illustrated. Each of the gate electrodes ECL, GSL, WL1 to WLn, and SSL and each of the mold insulating layers 110 may have a layered structure extending parallel to the top surface of the cell substrate 100. The gate electrodes ECL, GSL, WL1 to WLn, and SSL may be spaced apart from each other by the mold insulating layers 110 and may be sequentially stacked on the cell substrate 100. The mold structure has a step shape that extends downwardly like a staircase in a direction away from the cell array region R1, as illustrated in FIG. 4.

The gate electrodes ECL, GSL, WL1 to WLn, and SSL may be stacked in a step shape in the extension region R2. For example, the gate electrodes ECL, GSL, WL1 to WLn, and SSL may extend to have different lengths in the first direction X to have a step difference. In some example embodiments, the gate electrodes ECL, GSL, WL1 to WLn, and SSL may have a step difference in the second direction Y. Accordingly, each of the gate electrodes ECL, GSL, WL1 to WLn, and SSL may include a pad region (not illustrated) exposed from other gate electrodes. The pad region may refer to a region in which the cell contact structure 150 and the gate electrodes are in contact with each other.

In some example embodiments, the gate electrodes ECL, GSL, WL1 to WLn, and SSL may include an erase control line ECL, a ground select line GSL, and a plurality of word lines WL1 to WLn sequentially stacked on the cell substrate 100. In some other example embodiments, the erase control line ECL may be omitted.

The mold insulating layers 110 may be stacked in a step shape in the extension region R2. For example, the mold insulating layers 110 may extend to have different lengths in the first direction X to have a step difference. In some example embodiments, the mold insulating layers 110 may have a step difference in the second direction Y.

Each of the gate electrodes ECL, GSL, WL1 to WLn, and SSL may include a conductive material, for example, a metal such as tungsten (W), cobalt (Co), or nickel (Ni), or a semiconductor material such as silicon, but is not limited thereto. For example, each of the gate electrodes ECL, GSL, WL1 to WLn, and SSL may include tungsten (W). Unlike illustrated, the gate electrodes ECL, GSL, WL1 to WLn, and SSL may be multiple layers. For example, when the gate electrodes ECL, GSL, WL1 to WLn, and SSL are the multiple layers, the gate electrodes ECL, GSL, WL1 to WLn, and SSL may include a gate electrode barrier layer and a gate electrode filling layer. The gate electrode barrier layer may include, for example, titanium nitride (TiN), and the gate electrode filling layer may include tungsten (W), but is not limited thereto.

The mold insulating layer 110 may include an insulating material, for example, at least one of silicon oxide, silicon nitride, and silicon oxynitride, but is not limited thereto. For example, the mold insulating layer 110 may include silicon oxide.

The first interlayer insulating layer 121 may be formed on the cell substrate 100. The first interlayer insulating layer 121 may cover the mold structure MS. The first interlayer insulating layer 121 may include an oxide-based insulating material. The first interlayer insulating layer 121 may include, for example, silicon carbonate (SiOC), but is not limited thereto. The first interlayer insulating layer 121 may include a material having an etch selectivity to the second interlayer insulating layer 122. For example, an etch rate of the first interlayer insulating layer 121 may be greater than that of the second interlayer insulating layer 122.

The second interlayer insulating layer 122 may be provided on the first interlayer insulating layer 121. The second interlayer insulating layer 122 may cover the first interlayer insulating layer 121. The second interlayer insulating layer 122 may include an oxide-based insulating material. The second interlayer insulating layer 122 may include a material having an etch selectivity to the first interlayer insulating layer 121. An etch rate of the second interlayer insulating layer 122 may be smaller than that of the first interlayer insulating layer 121. The second interlayer insulating layer 122 may include, for example, at least one of silicon oxide, silicon oxynitride, and a low-k material having a dielectric constant lower than that of silicon oxide, but is not limited thereto.

The channel structure CH may be provided in the mold structure MS of the cell array region R1. The channel structure CH may extend in a vertical direction (hereinafter, referred to as a third direction Z) intersecting the top surface of the cell substrate 100 to penetrate through the mold structure MS. For example, the channel structure CH may have a pillar shape (e.g., a cylindrical shape) extending in the third direction Z. Accordingly, the channel structure CH may intersect each of the gate electrodes ECL, GSL, WL1 to WLn, and SSL.

The channel structure CH may include a semiconductor pattern 130 and an information storage layer 132, as illustrated in FIG. 8.

The semiconductor pattern 130 may extend in the third direction Z to penetrate through the mold structure MS. The semiconductor pattern 130 is illustrated only in a cup shape, but this is only an example. For example, the semiconductor pattern 130 may also have various shapes, such as a cylindrical shape, a rectangular shape, and a closely packed pillar shape. The semiconductor pattern 130 may include, for example, a semiconductor material such as single crystal silicon, polycrystalline silicon, an organic semiconductor material, and a carbon nanostructure, but is not limited thereto.

The information storage layer 132 may be interposed between the semiconductor pattern 130 and each of the gate electrodes ECL, GSL, WL1 to WLn, and SSL. For example, the information storage layer 132 may extend along an outer side surface of the semiconductor pattern 130. The information storage layer 132 may include, for example, at least one of silicon oxide, silicon nitride, silicon oxynitride, and a high-k material having a dielectric constant greater than that of silicon oxide. The high-k material may include, for example, at least one of aluminum oxide, hafnium oxide, lanthanum oxide, tantalum oxide, titanium oxide, lanthanum hafnium oxide, lanthanum aluminum oxide, dysprosium scandium oxide, and combinations thereof.

In some example embodiments, the plurality of channel structures CH may be arranged in a zigzag shape. For example, as illustrated in FIG. 3, the plurality of channel structures CH may be arranged to be misaligned with each other in the first direction X and the second direction Y. The plurality of channel structures CH arranged in the zigzag shape may further improve a degree of integration of the non-volatile memory device. In some example embodiments, the plurality of channel structures CH may be arranged in a honeycomb shape.

In some example embodiments, a dummy channel structure DCH may be formed in the mold structure MS of the extension region R2. The dummy channel structure DCH may be formed in a shape similar to that of the channel structure CH to reduce stress applied to the mold structure MS in the extension region R2.

In some example embodiments, the information storage layer 132 may be formed as multiple layers. For example, as illustrated in FIG. 8, the information storage layer 132 may include a tunnel insulating layer 132a, a charge storage layer 132b, and a blocking insulating layer 132c sequentially stacked on the outer side surface of the semiconductor pattern 130.

The tunnel insulating layer 132a may include, for example, silicon oxide or a high-k material (e.g., aluminum oxide ($Al_2O_3$) or hafnium oxide ($HfO_2$)) having a dielectric constant greater than that of silicon oxide. The charge storage layer 132b may include, for example, silicon nitride. The blocking insulating layer 132c may include, for example, silicon oxide or a high-k material (e.g., aluminum oxide ($Al_2O_3$) or hafnium oxide ($HfO_2$)) having a dielectric constant greater than that of silicon oxide.

In some example embodiments, the channel structure CH may further include a filling pattern 134. The filling pattern 134 may be formed to fill an inner portion of the semiconductor pattern 130 having the cup shape. The filling pattern 134 may include an insulating material, for example, silicon oxide, but is not limited thereto.

In some example embodiments, the channel structure CH may further include a channel pad 136, as illustrated in FIG. 4. The channel pad 136 may be formed to be connected to the semiconductor pattern 130. For example, the channel pad 136 may be formed in the first interlayer insulating layer 121 and the second interlayer insulating layer 122 to be connected to an upper portion of the semiconductor pattern 130. The channel pad 136 may include, for example, polysilicon doped with impurities, but is not limited thereto.

In some example embodiments, a source layer 102 and a source support layer 104 may be sequentially formed on the cell substrate 100, as illustrated in FIG. 4. The source layer 102 and the source support layer 104 may be interposed between the cell substrate 100 and the mold structure MS. For example, the source layer 102 and the source support layer 104 may extend along the top surface of the cell substrate 100.

In some example embodiments, the source layer 102 may be formed to be connected to the semiconductor pattern 130 of the channel structure CH. For example, as illustrated in FIG. 8, the source layer 102 may penetrate through the information storage layer 132 to be in contact with the semiconductor pattern 130. The source layer 102 may be provided as a common source line (e.g., CSL in FIG. 2) of the non-volatile memory device. The source layer 102 may include, for example, polysilicon or metal doped with impurities, but is not limited thereto.

In some example embodiments, the channel structure CH may penetrate through the source layer 102 and the source support layer 104. For example, a lower portion of the channel structure CH may penetrate through the source layer 102 and the source support layer 104 and be buried in the cell substrate 100.

In some example embodiments, the source support layer 104 may be used as a support layer to prevent a mold stack from collapsing or falling-down in a replacement process for forming the source layer 102.

Although not illustrated, a base insulating layer may also be interposed between the cell substrate 100 and the source layer 102. The base insulating layer may include, for example, at least one of silicon oxide, silicon nitride, and silicon oxynitride, but is not limited thereto.

In some example embodiments, the insulating substrate 101 may be formed in the extension region R2. The insulating substrate 101 may penetrate through the source layer 102 and the source support layer 104. Although it is illustrated that a top surface of the insulating substrate 101 is coplanar with a top surface of the source support layer 104, this is only an example. As another example, the top surface of the insulating substrate 101 may be higher than the top surface of the source support layer 104.

The block isolation region WLC may extend in the first direction X to cut the mold structure MS. The mold structure MS may be cut by a plurality of block isolation regions WLC to form a plurality of memory cell blocks (e.g., BLK1 to BLKn in FIG. 1). For example, two block isolation regions WLC adjacent to each other may define one memory cell block therebetween. The plurality of channel structures CH may be disposed in each of the memory cell blocks defined by the block isolation regions WLC.

It is illustrated in FIG. 3 that the number of channel structures CH arranged in a zigzag shape along the second direction Y in one memory cell block is only 9, but this is only an example. The number of channel structures CH disposed in each of the memory cell blocks is not limited to the illustrated one and may be any number of channel structures CH.

In some example embodiments, the block isolation region WLC may extend in the first direction X to cut the source layer 102 and the source support layer 104. It is illustrated that a bottom surface of the block isolation region WLC is coplanar with a bottom surface of the source layer 102, this is only an example. As another example, the bottom surface of the block isolation region WLC may also be lower than the bottom surface of the source layer 102.

In some example embodiments, the block isolation region WLC may include an insulating material. For example, the block isolation region WLC may be filled with the insulating material. The insulating material may include, for example, at least one of silicon oxide, silicon nitride, and silicon oxynitride, but is not limited thereto.

In some example embodiments, a string isolation structure SC may be provided in the mold structure MS. The string isolation structure SC may extend in the first direction X to cut the string select line SSL. Each of the memory cell blocks defined by the block isolation regions WLC may be divided by the string isolation structure SC to form a plurality of string regions. For example, the string isolation structure SC may define two string regions in one memory cell block.

The bit line BL may be formed on the mold structure MS and the second interlayer insulating layer 122. The bit line BL may extend in the second direction Y to intersect the block isolation region WLC. In addition, the bit line BL may extend in the second direction Y to be connected to the plurality of channel structures CH arranged along the second direction Y. For example, a bit line contact 162 connected to an upper portion of each of the channel structures CH may be formed in the second interlayer insulating layer 122. The bit line BL may be electrically connected to the channel structures CH through the bit line contact 162.

The cell contact structure 150 may be provided on the substrate of the extension region R2. The cell contact structure 150 may extend in the third direction Z in the extension region R2 to penetrate through the mold structure MS. The cell contact structure 150 may penetrate through the first interlayer insulating layer 121 in the extension region R2. The cell contact structure 150 may be connected to each of the gate electrodes ECL, GSL, WL1 to WLn, and SSL in the pad region. For convenience of description, it is illustrated that the number of the cell contact structures 150 is three, but the present disclosure is not limited thereto.

The top surface of each of the plurality of cell contact structures 150 may be all coplanar. In addition, the bottom surface of each of the plurality of cell contact structures 150 may be all coplanar. However, the present disclosure is not limited thereto.

The cell contact structure 150 may be in contact with the gate electrodes ECL, GSL, WL1 to WLn, and SSL, respectively. For example, the cell contact structure 150 may expose a portion of an upper surface GE_US and a side surface GE_SS of each of the gate electrodes ECL, GSL, WL1 to WLn, and SSL. The cell contact structure 150 may be in contact with the exposed upper surface GE_US and the side surface GE_SS of the gate electrodes ECL, GSL, WL1 to WLn, and SSL. For example, the cell contact structure 150 may expose an upper surface GE_US and a side surface GE_SS of the gate electrode disposed at the uppermost portion of the gate electrodes ECL, GSL, WL1 to WLn, and SSL stacked in the step shape. As a result, the cell contact structure 150 may be electrically connected to the gate electrodes ECL, GSL, WL1 to WLn, and SSL.

For example, in FIG. 7, the cell contact structure 150 may include a first surface 150a, a second surface 150b, and a third surface 150c. The first surface 150a of the cell contact structure 150 may be in contact with the side surface GE_SS of each of the gate electrodes ECL, GSL, WL1 to WLn, and SSL. The second surface 150b of the cell contact structure 150 may be in contact with a side surface of the first interlayer insulating layer 121. The third surface 150c of the cell contact structure 150 may be in contact with a portion of the upper surface GE_US of each of the gate electrodes ECL, GSL, WL1 to WLn, and SSL. The third surface 150c may intersect the first surface 150a and the second surface 150b. The third surface 150c may be connected to the first surface 150a and the second surface 150b.

The cell contact structure 150 may penetrate through the mold structure MS to be in contact with the side surface GE_SS and the upper surface GE_US of the gate electrode disposed at the highest level among the gate electrodes ECL, GSL, WL1 to WLn, and SSL stacked in the step shape. For example, in FIG. 4, the cell contact structure 150 closest to the channel structure CH may be in contact with the side surface and the upper surface of the string select line SSL disposed at the highest level. In addition, in FIG. 4, the cell contact structure 150 furthest from the channel structure CH may be in contact with the side surface and the upper surface of the gate electrode WLn.

The cell contact structure 150 according to some example embodiments may increase a contact area with the gate electrodes ECL, GSL, WL1 to WLn, and SSL through the first surface 150a and the third surface 150c. Accordingly, a non-volatile memory device having further improved reliability may be provided.

In some example embodiments, the cell contact structure 150 may include a first portion 150_1 and a second portion 150_2. The first portion 150_1 of the cell contact structure 150 may be a portion which is in contact with the side surface GE_SS of each of the gate electrodes ECL, GSL, WL1 to WLn, and SSL. The first portion 150_1 of the cell contact structure 150 may completely overlap the side surface GE_SS of each of the gate electrodes ECL, GSL, WL1 to WLn, and SSL in a horizontal direction. That is, a side surface of the first portion 150_1 of the cell contact structure 150 may be the first surface 150a of the cell contact structure 150.

The second portion 150_2 of the cell contact structure 150 may be provided on the first portion 150_1. The second portion 150_2 of the cell contact structure 150 may be a portion which is in contact with the side surface of the first interlayer insulating layer 121. The second portion 150_2 of the cell contact structure 150 may completely overlap the side surface of the first interlayer insulating layer 121 in the horizontal direction. That is, a side surface of the second portion 150_2 of the cell contact structure 150 may be the second surface 150b of the cell contact structure 150.

In some example embodiments, a first width W1 of the first portion 150_1 of the cell contact structure 150 is smaller than a second width W2 of the second portion 150_2 of the cell contact structure 150, as illustrated in FIG. 7. In other words, the width W1 between the first surfaces 150a of the cell contact structure 150 is smaller than the width W2 between the second surfaces 150b of the cell contact structure 150. This is because the first interlayer insulating layer 121 is recessed more than a sacrificial insulating layer (ILD_SC in FIG. 19) in a process of forming the cell contact structure 150.

In some example embodiments, a vertical height H1 of the first interlayer insulating layer 121 is greater than vertical heights H2 and H3 of the gate electrodes ECL, GSL, WL1 to WLn, and SSL. For example, in FIG. 7, the vertical height H1 of the first interlayer insulating layer 121 is greater than the vertical heights H2 and H3 of the string select line SSL. On the other hand, the vertical height H2 of the gate electrode in contact with the cell contact structure 150 is the same as the vertical height H3 of the gate electrode not in contact with the cell contact structure 150. However, the present disclosure is not limited thereto.

The cell contact structure 150 may be multiple layers. For example, the cell contact structure 150 may include a barrier layer 153 and a filling layer 151. The barrier layer 153 may include at least one of a metal, metal nitride, metal carbonitride, and a two-dimensional (2D) material. For example, the 2D material may be a metallic material and/or a semiconductor material. The 2D material may include a two-dimensional allotrope or a two-dimensional compound. For example, the barrier layer 153 may include titanium nitride (TiN). The filling layer 151 may include a metal such as tungsten (W), cobalt (Co), or nickel (Ni), but the type of the metal is not limited thereto. For example, the filling layer 151 may include tungsten (W).

The insulating ring 125 may be provided in the mold structure MS. The insulating ring 125 may be interposed between the cell contact structure 150 and each of the gate electrodes ECL, GSL, WL1 to WLn, and SSL. The insulating ring 125 may electrically insulate the cell contact structure 150 from some of the gate electrodes ECL, GSL, WL1 to WLn, and SSL. For example, as illustrated in FIG. 6, the insulating ring 125 may be an annular structure surrounding the cell contact structure 150.

The insulating ring 125 may include an outer sidewall 125a and an inner sidewall 125b. The outer sidewall 125a of the insulating ring 125 may be in contact with the side surfaces of the gate electrodes ECL, GSL, WL1 to WLn, and SSL. The inner sidewall 125b of the insulating ring 125 may be in contact with the cell contact structure 150. A third width W3 between the outer sidewalls 125a of the insulating ring 125 may be substantially the same as the first width W1 of the first portion 150_1 of the cell contact structure 150, as illustrated in FIG. 7. The third width W3 between the outer sidewalls 125a of the insulating ring 125 may be smaller than the second width W2 of the second portion 150_2 of the cell contact structure 150, as illustrated in FIG. 7.

In some example embodiments, the inner sidewall 125b of the insulating ring 125 may not protrude from a side surface 110_SS of the mold insulating layer 110. The inner sidewall 125b of the insulating ring 125 may be coplanar with the side surface 110_SS of the mold insulating layer 110. However, the present disclosure is not limited thereto.

The insulating ring 125 may electrically isolate other gate electrodes not exposed in the pad region among the gate electrodes ECL, GSL, WL1 to WLn, and SSL from the cell contact structure 150. For example, the insulating ring 125 may prevent the remaining gate electrodes other than the uppermost gate electrode connected to the cell contact structure 150 from being in contact with the cell contact structure 150.

The insulating ring 125 may include an insulating material. The insulating ring 125 may include, for example, an oxide-based insulating material. For example, the insulating ring 125 may include silicon oxide, but is not limited thereto.

The cell contact structure 150 may be connected to the first wiring structure 170 on the second interlayer insulating layer 122. For example, the first inter-wiring insulating layer 140 may be provided on the second interlayer insulating layer 122. The first wiring structure 170 may be formed in the first inter-wiring insulating layer 140 to be connected to the cell contact structure 150. The cell contact structure 150 and the first wiring structure 170 may be connected through a first wiring contact 164. The first wiring structure 170 may also be connected to the bit line BL. The first wiring structure 170 and the first wiring contact 164 may include a conductive material. For example, the first wiring structure 170 and the first wiring contact 164 may include tungsten (W) or copper (Cu), but are not limited thereto.

A peripheral circuit board 200 may be disposed on a lower side of the cell substrate 100. For example, a top surface of the peripheral circuit board 200 may face a bottom surface of the cell substrate 100. The peripheral circuit board 200 may include, for example, a semiconductor substrate such as a silicon substrate, a germanium substrate, or a silicon-germanium substrate. Alternatively, the peripheral circuit board 200 may also include a silicon-on-insulator (SOI) substrate or a germanium-on-insulator (GOI) substrate.

A peripheral circuit element PT may be formed on the peripheral circuit board 200. The peripheral circuit element PT may constitute a peripheral circuit (e.g., 30 in FIG. 1) that controls the operation of the non-volatile memory device. For example, the peripheral circuit element PT may include control logic (e.g., 37 in FIG. 1), a row decoder (e.g., 33 in FIG. 1), and a page buffer (e.g., 35 in FIG. 1). In the following description, a surface of the peripheral circuit board 200 on which the peripheral circuit element PT is disposed may be referred to as a front side of the peripheral circuit board 200. Conversely, a surface of the peripheral circuit board 200 opposite to the front side of the peripheral circuit board 200 may be referred to as a back side of the peripheral circuit board 200.

The peripheral circuit element PT may include, for example, a transistor, but is not limited thereto. For example, the peripheral circuit element PT may include various active elements such as transistors, as well as various passive elements such as capacitors, resistors, and inductors.

In some example embodiments, the back side of the cell substrate 100 may face the front side of the peripheral circuit board 200. For example, a second inter-wiring insulating layer 220 covering the peripheral circuit element PT may be formed on the front side of the peripheral circuit board 200. The cell substrate 100 and/or the insulating substrate 101 may be stacked on a top surface of the second inter-wiring insulating layer 220.

The first wiring structure 170 may be connected to the peripheral circuit element PT through the cell contact structure 150. For example, second wiring structures 241 and 242 connected to the peripheral circuit element PT may be formed in the second inter-wiring insulating layer 220. The cell contact structure 150 may penetrate through the first and second interlayer insulating layers 121 and 122 to connect the first wiring structure 170 and the second wiring structures 241 and 242. The second wiring structures 241 and 242 may be connected to each other through second wiring contacts 231 and 232. In addition, the second wiring structures 241 and 242 may be electrically connected to the peripheral circuit element PT through the second wiring contacts 231 and 232. As a result, the bit line BL, each of the gate electrodes ECL, GSL, WL1 to WLn, and SSL, and/or the source layer 102 may be electrically connected to the peripheral circuit element PT.

The peripheral circuit elements PT may be isolated by a peripheral element isolation layer 205. For example, the peripheral element isolation layer 205 may be provided in the peripheral circuit board 200. The peripheral element isolation layer 205 may be a shallow trench isolation (STI) layer. The peripheral element isolation layer 205 may define active regions of the peripheral circuit elements PT. The peripheral element isolation layer 205 may include an insulating material. The peripheral element isolation layer 205 may include, for example, at least one of silicon nitride, silicon oxide, and silicon oxynitride.

FIGS. 9 to 12 are example views for describing a non-volatile memory device according to some example embodiments. For convenience of explanation, points different from those described with reference to FIGS. 3 to 8 will be mainly described.

Figure 9:
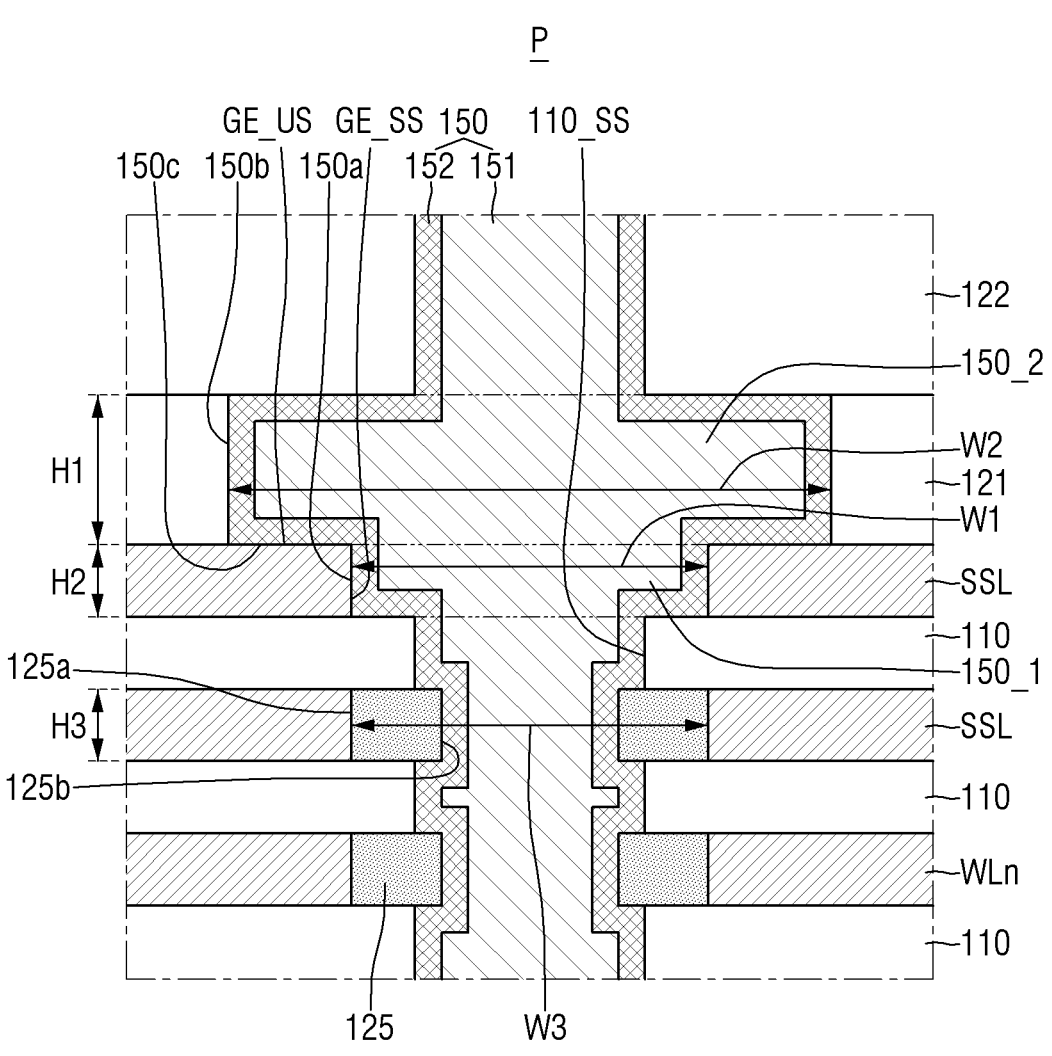
FIGS. 9 to 12 are example views for describing a non-volatile memory device according to some example embodiments.

First, referring to FIG. 9, the inner sidewall 125b of the insulating ring 125 may protrude from the side surface 110_SS of the mold insulating layer 110 toward the cell contact structure 150, as illustrated.

That is, a width between the inner sidewalls 125b of the insulating ring 125 is smaller than a width between the side surfaces 110_SS of the mold insulating layer 110. In a process of removing a pre-insulating ring (125p in FIG. 20), since a portion of the pre-insulating ring is not removed, a portion of the insulating ring 125 may protrude from the side surface 110_SS of the mold insulating layer 110 toward the cell contact structure 150.

Figure 10:
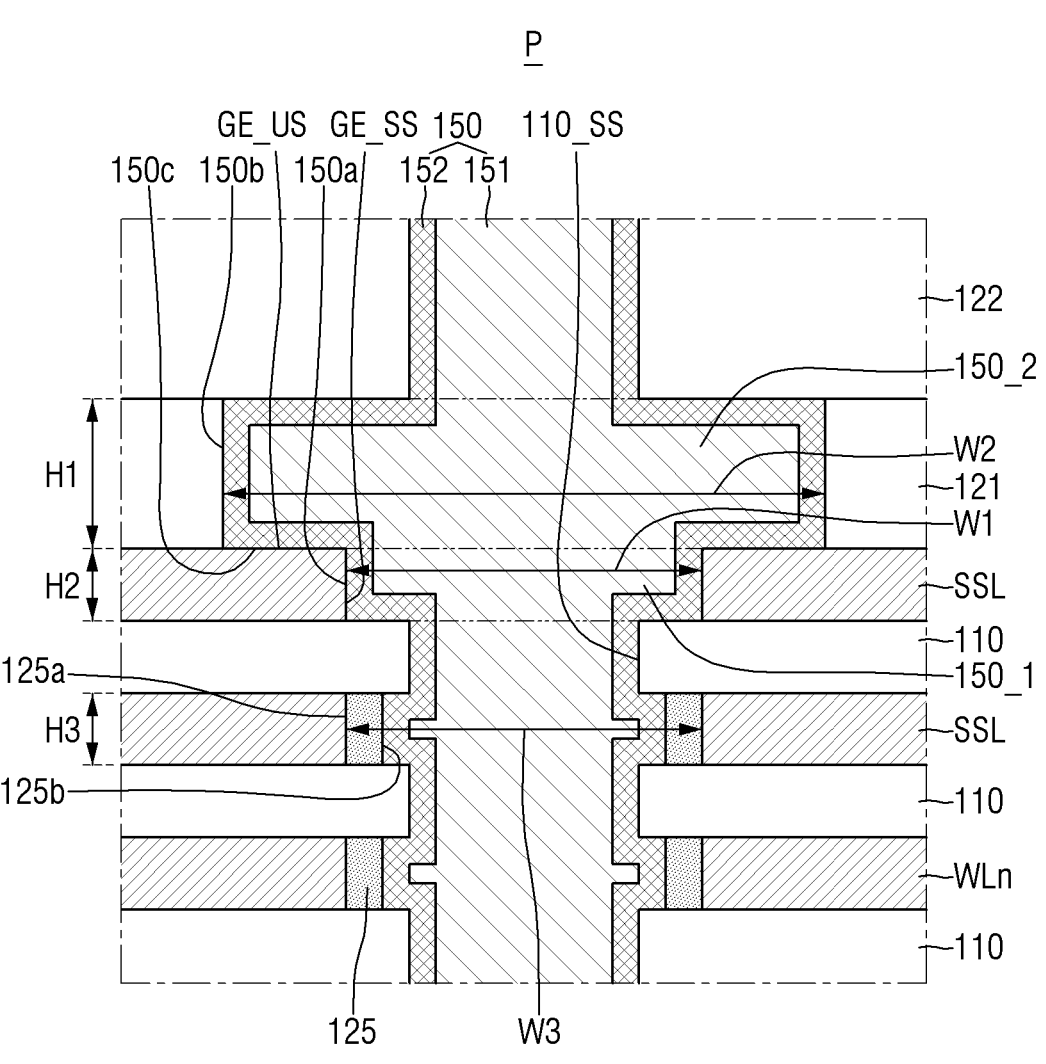

Referring to FIG. 10, the inner sidewall 125b of the insulating ring 125 may protrude from the side surface 110_SS of the mold insulating layer 110 toward the gate electrodes ECL, GSL, WL1 to WLn, and SSL, as illustrated.

That is, the width between the inner sidewalls 125b of the insulating ring 125 is greater than the width between the side surfaces 110_SS of the mold insulating layer 110. In the process of removing the pre-insulating ring (125p in FIG. 20), since a portion of the pre-insulating ring is more recessed, a portion of the cell contact structure 150 may protrude from the side surface 110_SS of the mold insulating layer 110 toward the gate electrodes ECL, GSL, WL1 to WLn, and SSL.

Figure 11:
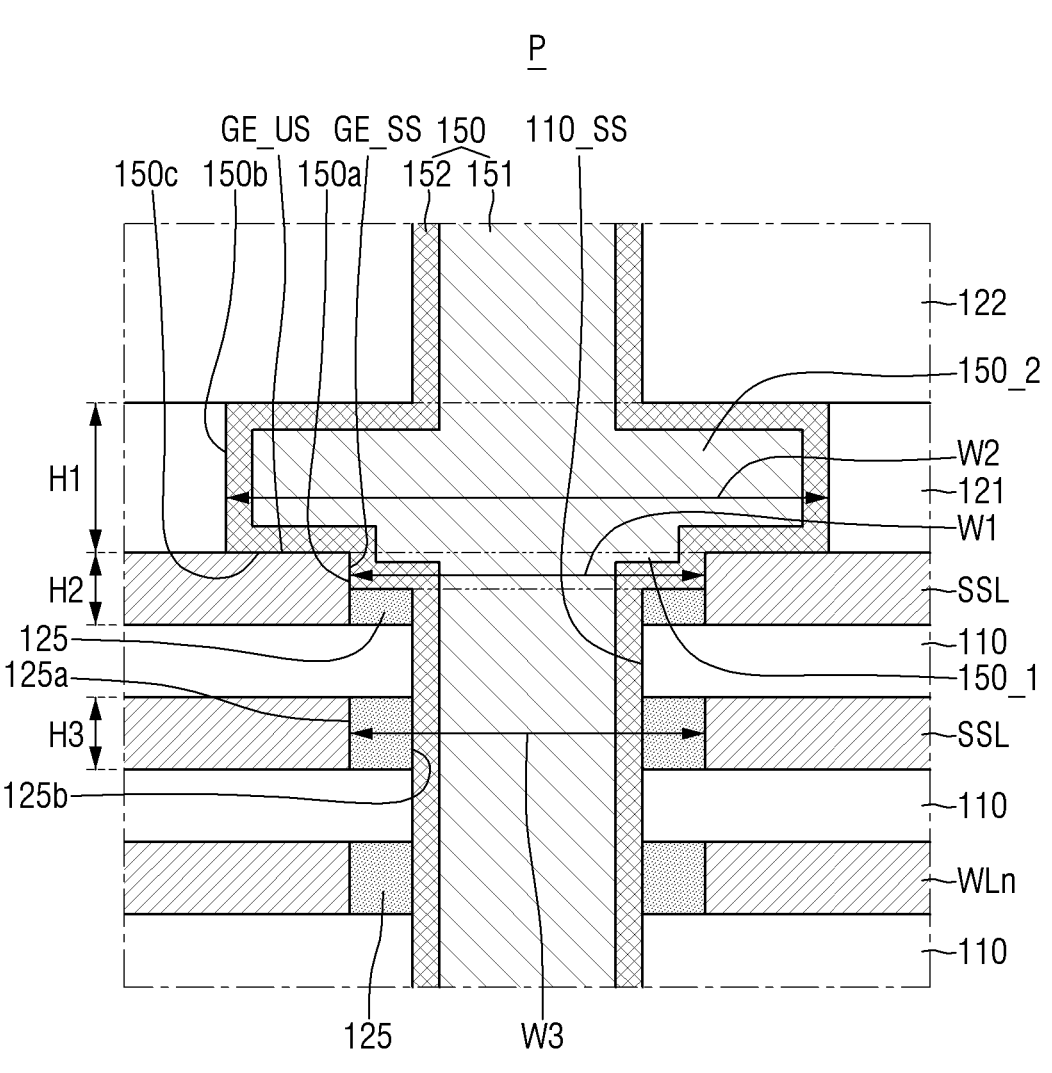

Referring to FIG. 11, a portion of the first portion 150_1 of the cell contact structure 150 may be in contact with the insulating ring 125. Specifically, a portion of the bottom surface of the first portion 150_1 of the cell contact structure 150 may be in contact with the insulating ring 125, as illustrated.

For example, the insulating ring 125 may be formed on the side surface GE_SS of the uppermost gate electrode in contact with the cell contact structure 150. In the process of removing the pre-insulating ring (125p in FIG. 20), the pre-insulating ring on the side surface GE_SS of the uppermost gate electrode may not be partially removed. In this case, a portion of the first portion 150_1 of the cell contact structure 150 may be in contact with the insulating ring 125. In this case, a vertical height H2 of the uppermost gate electrode in contact with the cell contact structure 150 may be greater than a vertical height of the first portion 150_1 of the cell contact structure 150, as illustrated.

Figure 12:
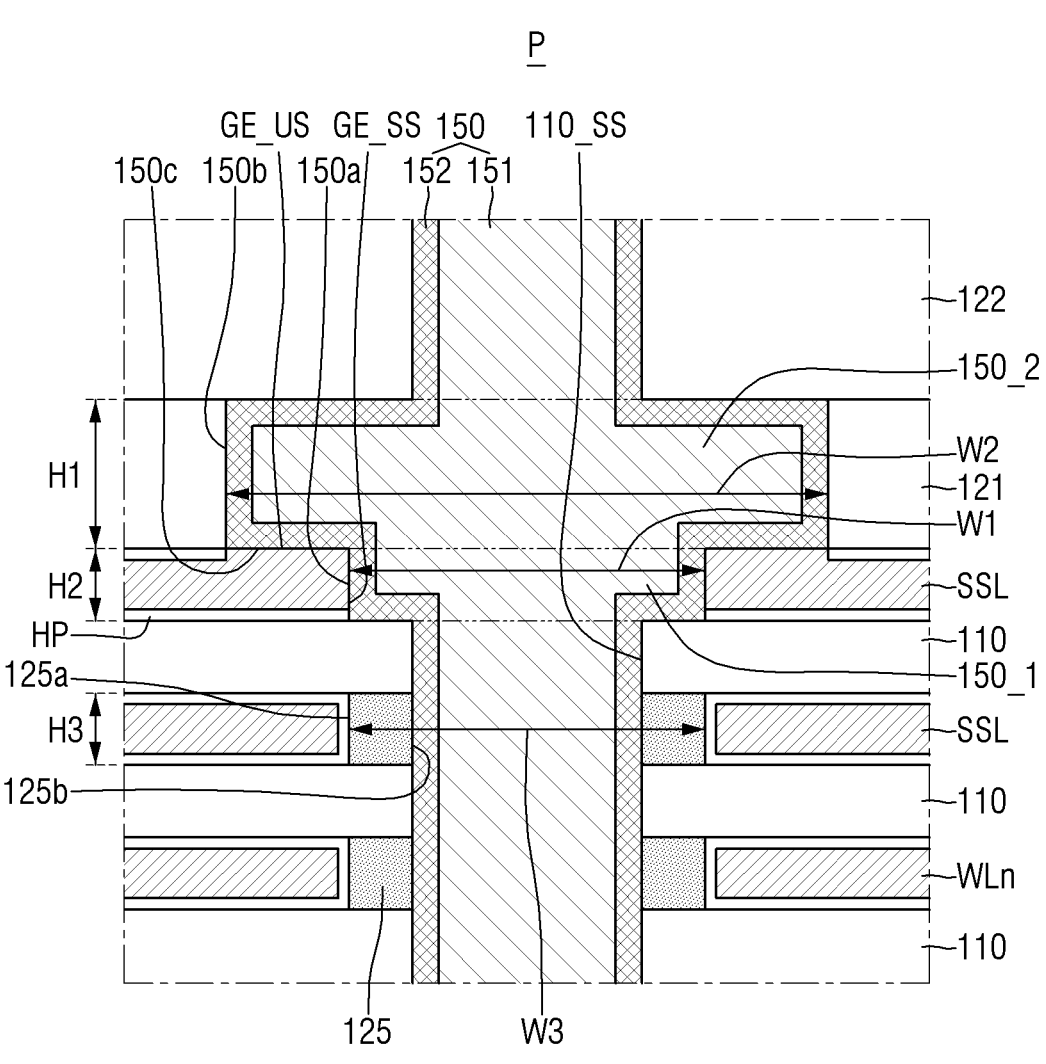

Referring to FIG. 12, a metal oxide HP surrounding the gate electrodes ECL, GSL, WL1 to WLn, and SSL may be further included. The metal oxide HP may surround the surfaces of the gate electrodes ECL, GSL, WL1 to WLn, and SSL.

The metal oxide HP may not be formed in a portion in contact with the cell contact structure 150. For example, the metal oxide HP may not be formed on the first surface 150a and the third surface 150c of the cell contact structure 150. The metal oxide HP may be provided to a portion in which the gate electrodes ECL, GSL, WL1 to WLn, and SSL and the first interlayer insulating layer 121 are in contact, a portion in which the gate electrodes ECL, GSL, WL1 to WLn, and SSL and the mold insulating layer 110 are in contact, and a portion in which the gate electrodes ECL, GSL, WL1 to WLn, and SSL and the insulating ring 125 are in contact.

The metal oxide HP may include, for example, silicon oxide or a high-k material (e.g., aluminum oxide ($Al_2O_3$) or hafnium oxide ($HfO_2$)).

Figure 13:
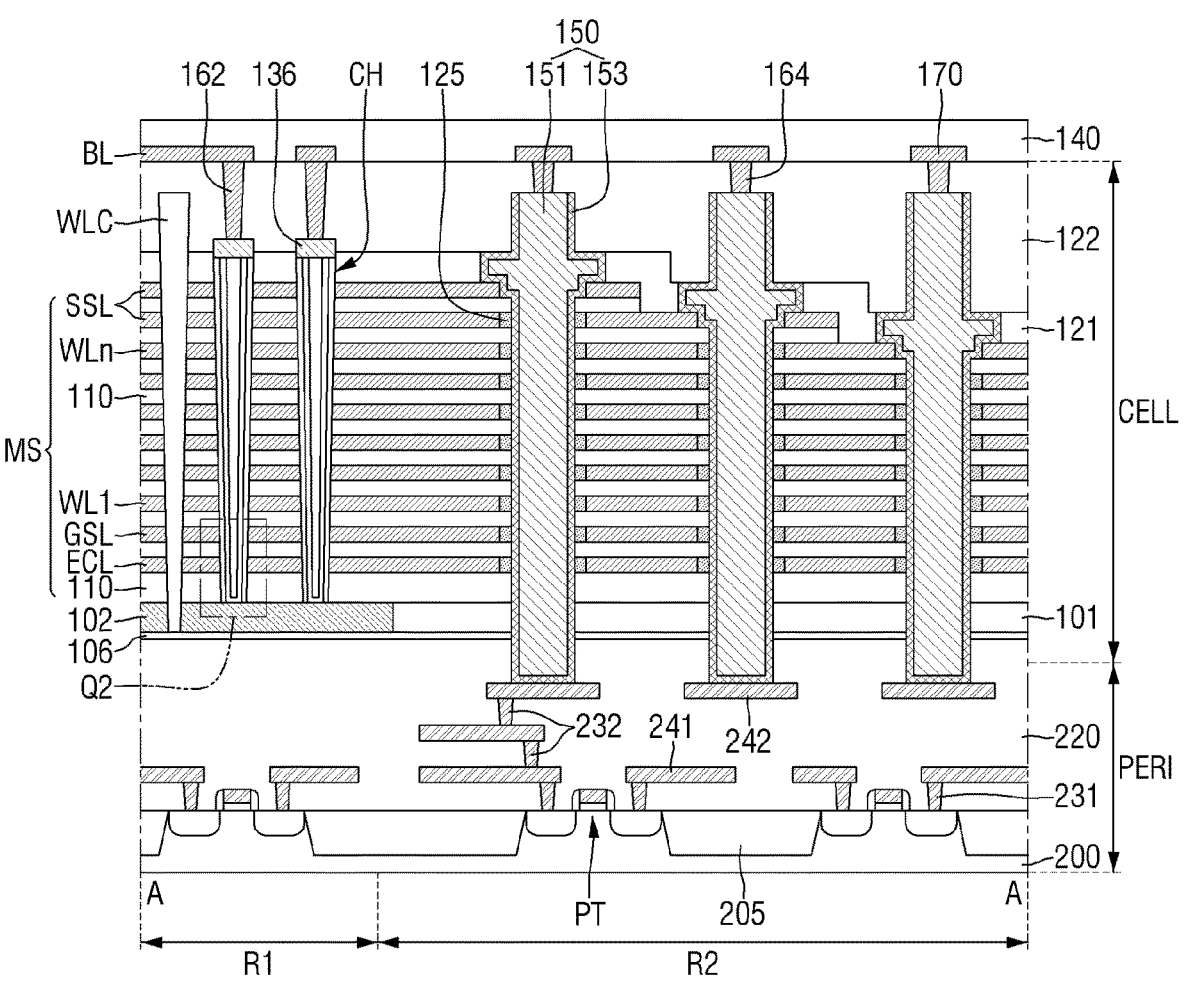
FIG. 13 is an example cross-sectional view for describing a non-volatile memory device according to some example embodiments.
Figure 14:
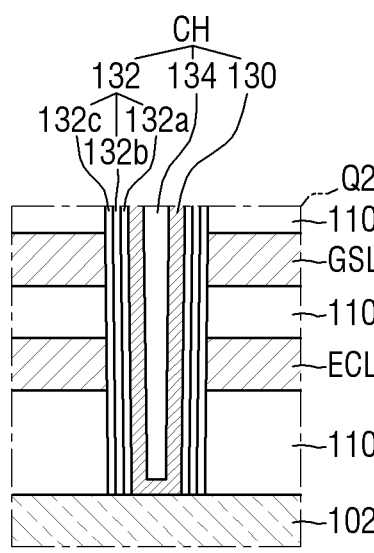
FIG. 14 is an enlarged cross-sectional view for describing a region Q2 of FIG. 13.

FIG. 13 is an example cross-sectional view for describing a non-volatile memory device according to some example embodiments. FIG. 14 is an enlarged cross-sectional view for describing a region Q2 of FIG. 13. For convenience of explanation, points different from those described with reference to FIGS. 3 to 8 will be mainly described.

Referring to FIGS. 13 and 14, the source layer 102 may be connected to the semiconductor pattern 130. The source layer 102 may be in contact with a bottom surface of the information storage layer 132 and a bottom surface of the semiconductor pattern 130. The source layer 102 may not expose a sidewall of the semiconductor pattern 130. The source layer 102 may expose the bottom surface of the semiconductor pattern 130. In this case, the source support layer (104 in FIG. 3) may not be provided.

In some example embodiments, a metal silicide layer 106 may be provided on a lower side of the source layer 102 and the insulating substrate 101. The metal silicide layer 106 may be provided between the source layer 102 and the insulating substrate 101 and the second inter-wiring insulating layer 220. Alternatively, the metal silicide layer 106 may not be provided.

Figure 15:
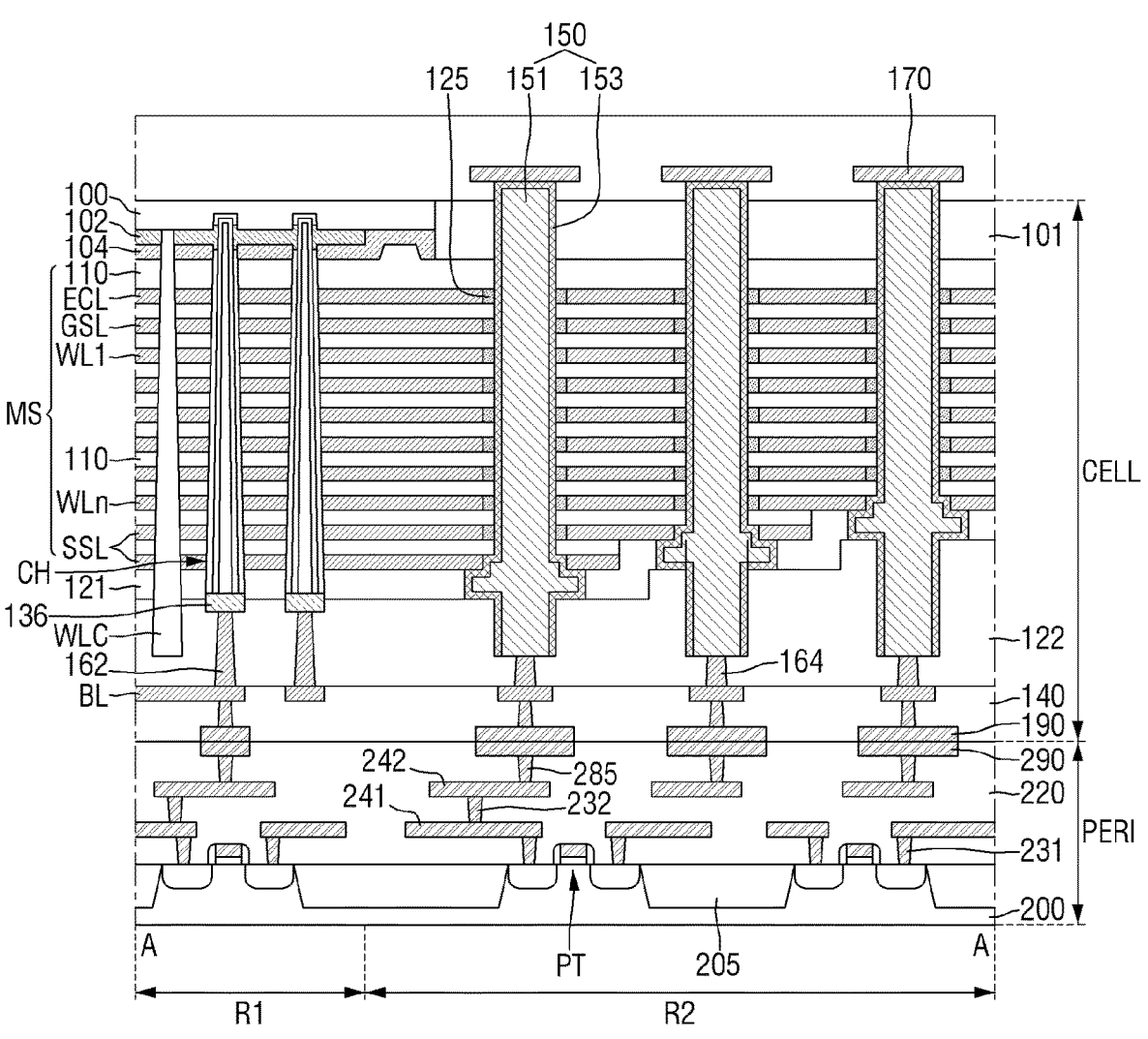
FIG. 15 is an example cross-sectional view for describing a non-volatile memory device according to some example embodiments.

FIG. 15 is an example cross-sectional view for describing a non-volatile memory device according to some example embodiments. For convenience of explanation, points different from those described with reference to FIGS. 3 to 8 will be mainly described.

Referring to FIG. 15, in the non-volatile memory device according to some example embodiments, a front side of the cell substrate 100 faces a front side of the peripheral circuit board 200.

For example, the non-volatile memory device according to some example embodiments may have a chip to chip (C2C) structure. The C2C structure means fabricating an upper chip including a memory cell region CELL on a first wafer (e.g., the cell substrate 100), fabricating a lower chip including a peripheral circuit region PERI on a second wafer (e.g., the peripheral circuit board 200) different from the first wafer, and then connecting the upper chip and the lower chip to each other by a bonding method.

As an example, the bonding method may refer to a method of electrically connecting a first bonding metal 190 formed on the uppermost metal layer of the upper chip and a second bonding metal 290 formed on the uppermost metal layer of the lower chip to each other. For example, when the first bonding metal 190 and the second bonding metal 290 are formed of copper (Cu), the bonding method may be a Cu—Cu bonding method. However, this is only an example, and the first bonding metal 190 and the second bonding metal 290 may be formed of various other metals such as aluminum (Al) or tungsten (W).

As the first bonding metal 190 and the second bonding metal 290 are connected, the first wiring structure 170 may be connected to the second wiring structures 241 and 242. For example, the second bonding metal 290 and the second wiring structures 241 and 242 may be connected to each other through the third wiring contact 285. As a result, each of the gate electrodes ECL, GSL, WL1 to WLn, and SSL, and/or the source layer 102 may be electrically connected to the peripheral circuit element PT.

FIGS. 16 to 24 are intermediate step views for describing a method of manufacturing a non-volatile memory device according to some example embodiments. Hereinafter, a method of manufacturing a non-volatile memory device according to some example embodiments will be described with reference to FIGS. 16 to 24. For reference, FIGS. 16 to 24 may illustrate a method of forming a cell contact structure of a non-volatile memory device.

Figure 16:
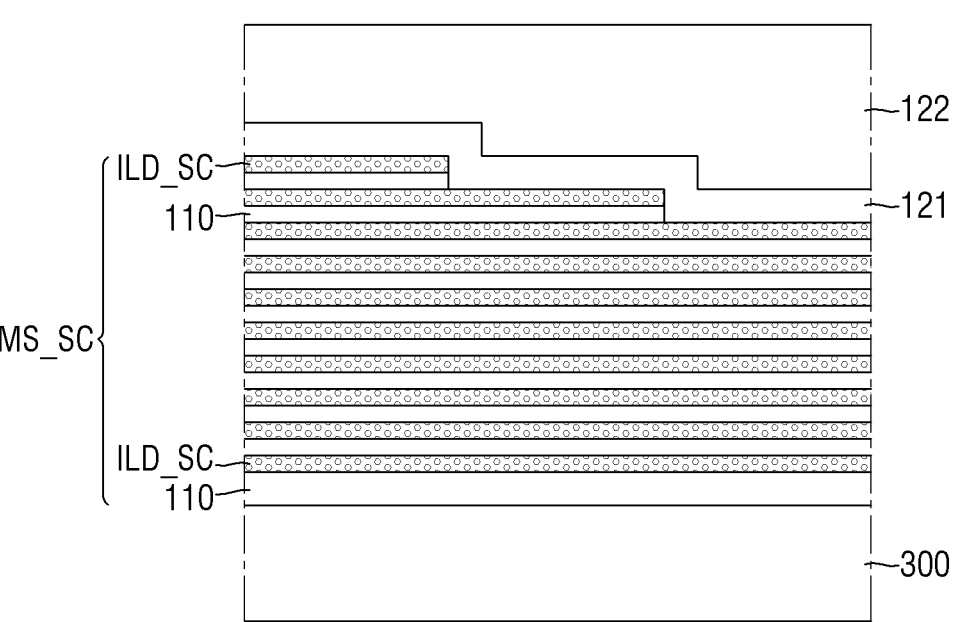
FIGS. 16 to 24 are intermediate step views for describing a method of manufacturing a non-volatile memory device according to some example embodiments.

First, referring to FIG. 16, a sacrificial mold structure MS_SC may be formed on a substrate 300.

The sacrificial mold structure MS_SC may be formed by alternately stacking a mold insulating layer 110 and a sacrificial insulating layer ILD_SC. That is, the sacrificial insulating layer ILD_SC may be provided between the mold insulating layers 110, and the mold insulating layer 110 may be provided between the sacrificial insulating layers ILD_SC. The substrate 300 may be the cell substrate 100 of FIG. 3, the insulating substrate 101, or the peripheral circuit board 200.

Subsequently, the sacrificial mold structure MS_SC may be patterned. The sacrificial mold structure MS_SC may be patterned to have a step shape, as illustrated. That is, the mold insulating layer 110 and the sacrificial insulating layer ILD_SC may be stacked in a step shape.

Subsequently, a first interlayer insulating layer 121 and a second interlayer insulating layer 122 may be sequentially formed on the sacrificial mold structure MS_SC. Each of the first interlayer insulating layer 121 and the second interlayer insulating layer 122 may include an oxide-based insulating material. The first interlayer insulating layer 121 may include a material having an etch selectivity to the second interlayer insulating layer 122. An etch rate of the first interlayer insulating layer 121 may be greater than that of the second interlayer insulating layer 122.

The sacrificial insulating layer ILD_SC may include a material having an etch selectivity to the mold insulating layer 110. For example, the sacrificial insulating layer ILD_SC may include a nitride-based insulating material. For example, the sacrificial insulating layer ILD_SC may include silicon nitride, but is not limited thereto.

Figure 17:
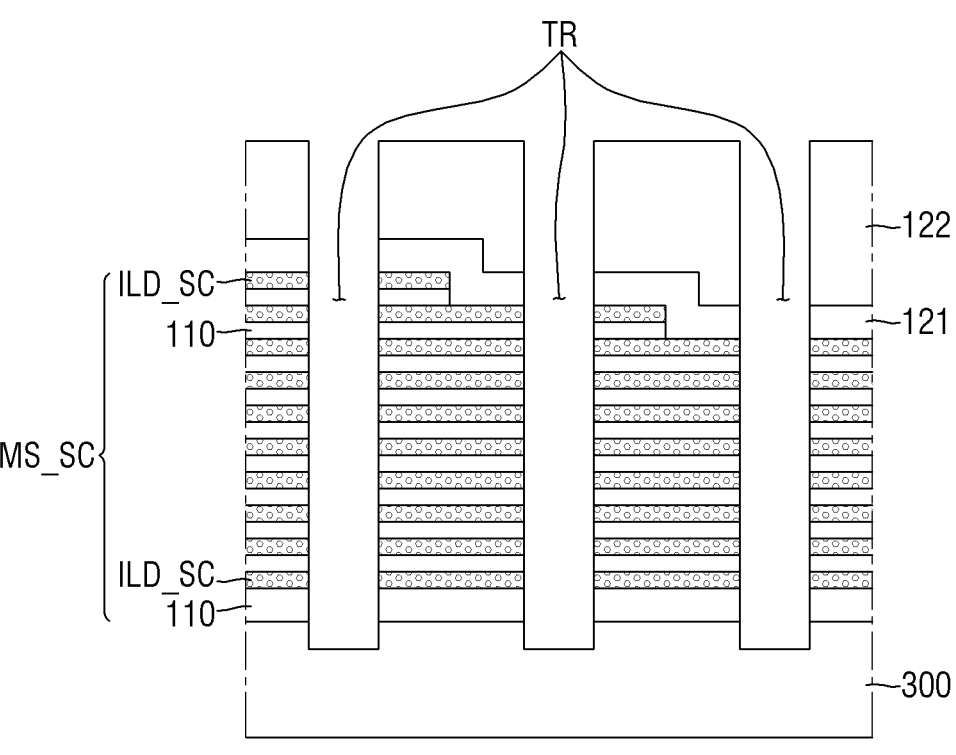

Referring to FIG. 17, a trench TR penetrating through the first interlayer insulating layer 121, the second interlayer insulating layer 122, and the sacrificial mold structure MS_SC may be formed.

The trench TR may expose a side surface of the first interlayer insulating layer 121, a side surface of the sacrificial insulating layer ILD_SC, and a side surface of the mold insulating layer 110. The trench TR may be formed by a dry etching process.

Figure 18:
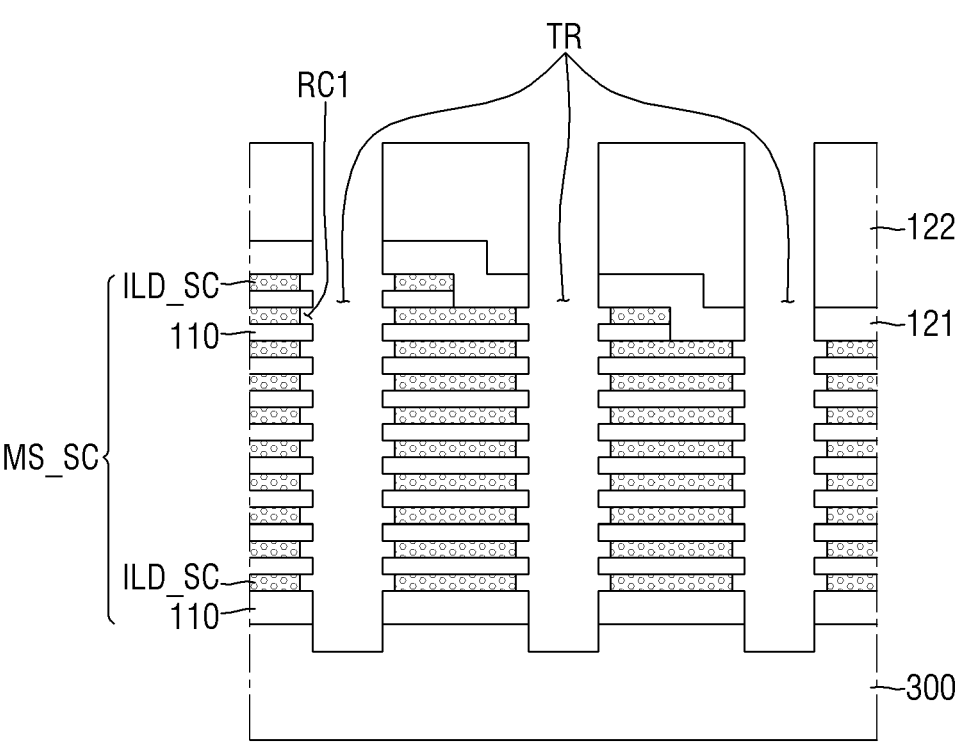

Referring to FIG. 18, a first recess RC1 may be formed by removing a portion of the sacrificial insulating layer ILD_SC.

The first recess RC1 may be formed using a wet etching process. An etchant may permeate into the sacrificial insulating layer ILD_SC exposed by the trench TR. Since the sacrificial insulating layer ILD_SC includes a nitride-based insulating material, and the first interlayer insulating layer 121, the second interlayer insulating layer 122, and the mold insulating layer 110 include an oxide-based insulating material, the sacrificial insulating layer ILD_SC has an etch selectivity to the first interlayer insulating layer 121, the second interlayer insulating layer 122, and the mold insulating layer 110. Accordingly, the sacrificial insulating layer ILD_SC may be selectively removed using a wet etching process.

Figure 19:
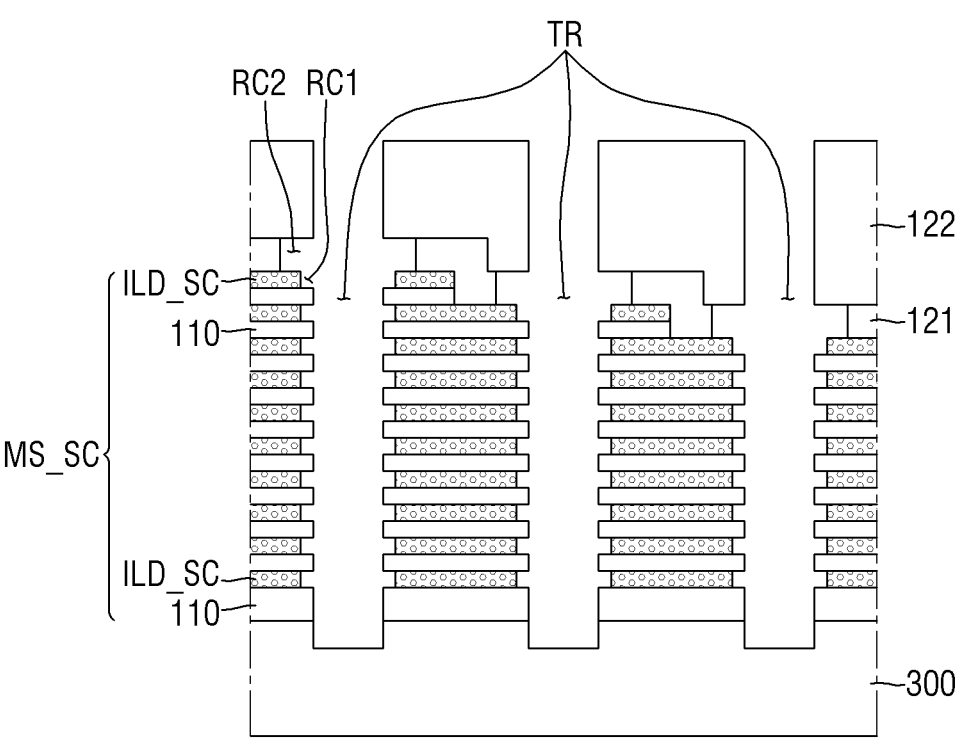

Referring to FIG. 19, a second recess RC2 may be formed by removing a portion of the first interlayer insulating layer 121.

The second recess RC2 may be formed using a wet etching process. An etchant may permeate into the side surface of the first interlayer insulating layer 121 exposed by the trench TR. Since the first interlayer insulating layer 121 has an etch selectivity to the second interlayer insulating layer 122, only the first interlayer insulating layer 121 may be selectively removed. In addition, since the etch rate of the first interlayer insulating layer 121 is greater than that of the second interlayer insulating layer 122, more of the first interlayer insulating layer 121 may be removed. In some example embodiments, a horizontal depth of the second recess RC2 may be greater than a horizontal depth of the first recess RC1.

Figure 20:
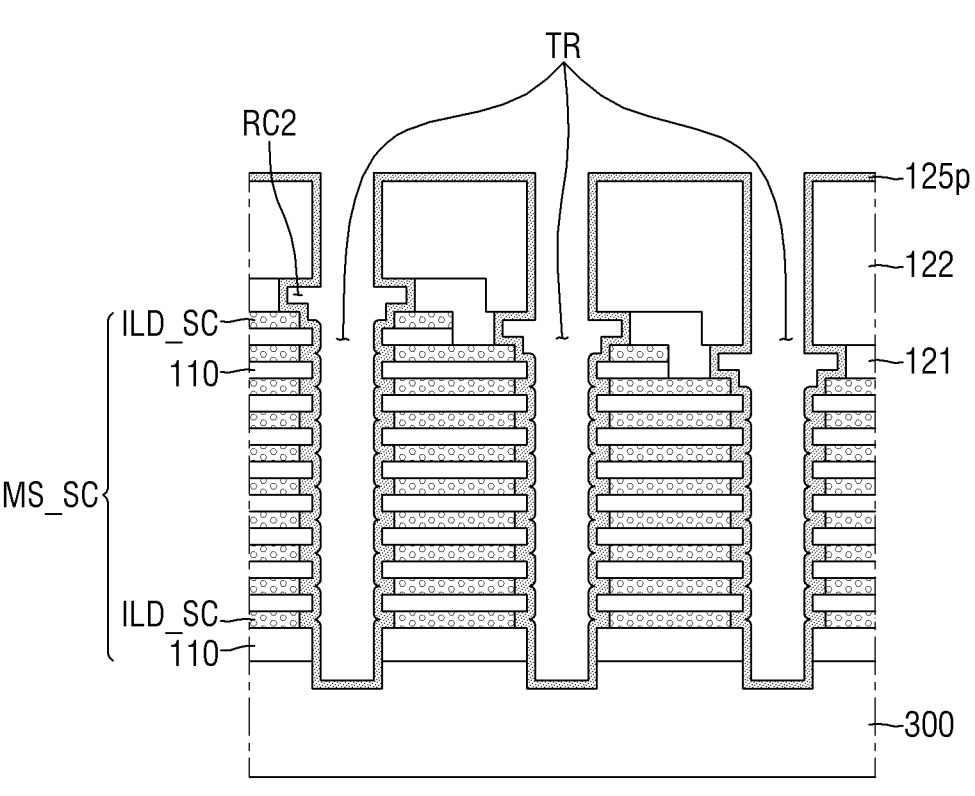

Referring to FIG. 20, a pre-insulating ring 125*p* may be formed along the exposed surface.

For example, the pre-insulating ring 125*p* may be conformally formed on a sidewall and a bottom surface of the trench TR, a surface of the first recess RC1, a surface of the second recess RC2, and a side surface and a top surface of the second interlayer insulating layer 122. The pre-insulating ring 125*p* may be formed using an atomic layer deposition (ALD) method.

Since the first recess RC1 has a small vertical width, the pre-insulating ring 125*p* may completely fill the first recess RC1. On the other hand, since the second recess RC2 has a large vertical width, the pre-insulating ring 125*p* may not completely fill the second recess RC2.

Figure 21:
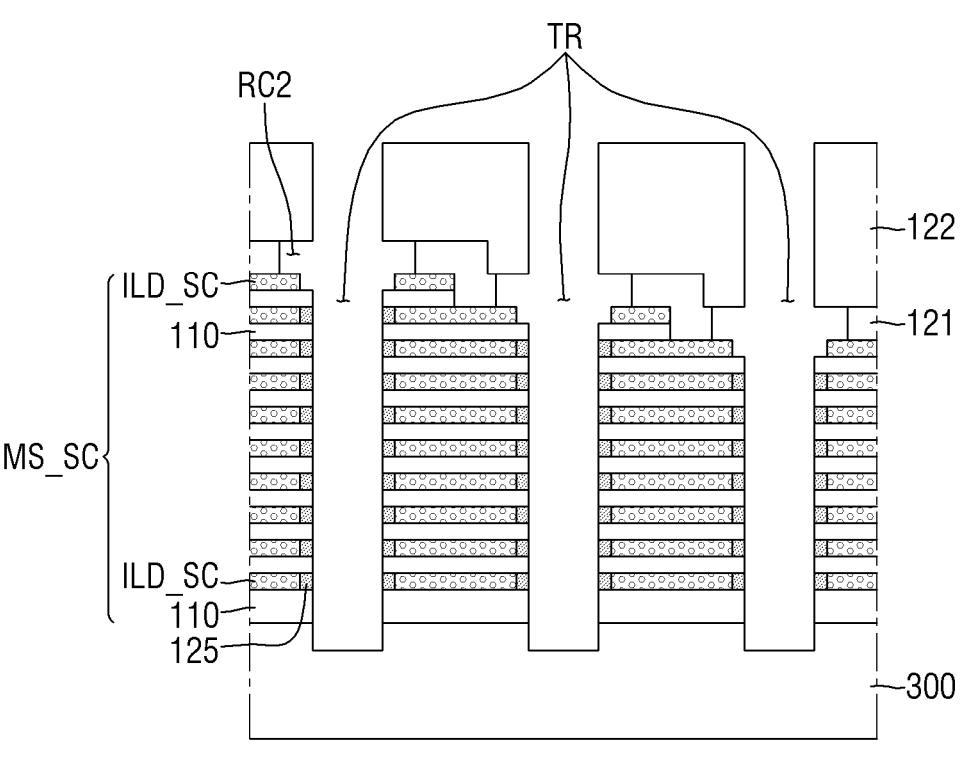

Referring to FIG. 21, an insulating ring 125 may be formed by removing the pre-insulating ring 125*p* formed on the surface of the second recess RC2.

The insulating ring 125 may be formed through a wet etching process. In a process of removing the pre-insulating ring 125*p* formed on the surface of the second recess RC2, a portion of the pre-insulating ring 125*p* formed on the first recess RC1 may be removed. Accordingly, an inner sidewall of the pre-insulating ring 125*p* exposed by the trench TR may be coplanar with the side surface of the mold insulating layer 110 exposed by the trench TR. However, the present disclosure is not limited thereto.

Figure 22:
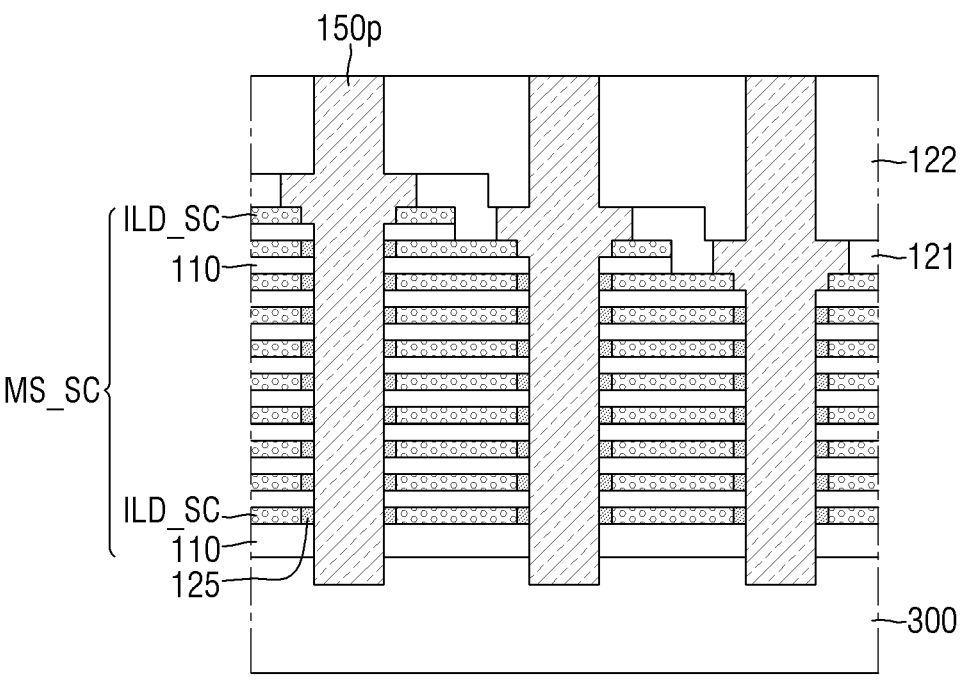

Referring to FIG. 22, a pre-cell contact structure 150*p* may be formed. The pre-cell contact structure 150*p* may fill the trench TR. The pre-cell contact structure 150*p* may be in contact with the side surface of the mold insulating layer 110 and the inner sidewall of the insulating ring 125. In addition, the pre-cell contact structure 150*p* may fill the second recess.

The pre-cell contact structure 150*p* may include a semiconductor material. For example, the pre-cell contact structure 150*p* may include polysilicon doped with impurities, but is not limited thereto.

Figure 23:
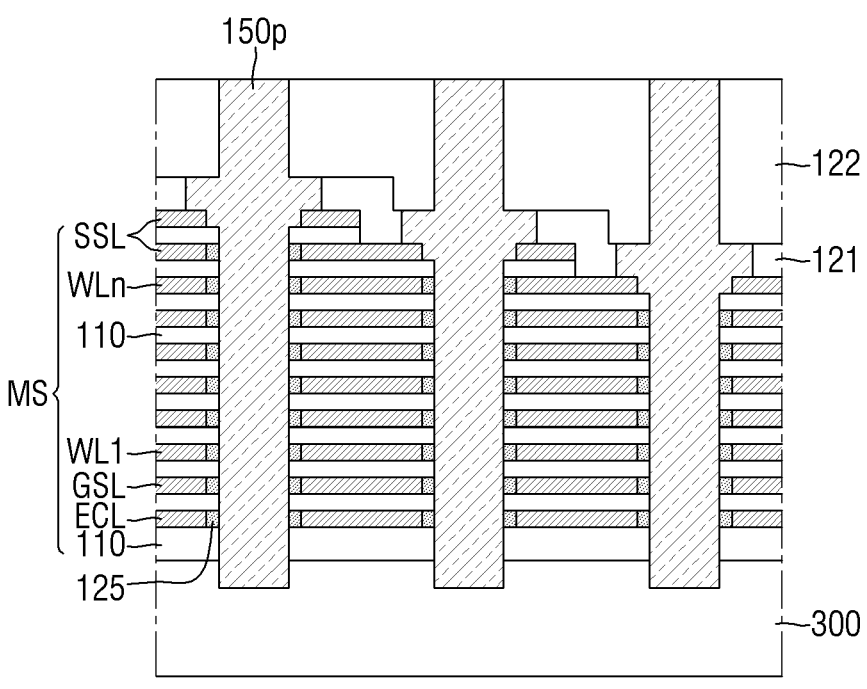

Referring to FIG. 23, gate electrodes ECL, GSL, WL1 to WLn, and SSL may be formed.

The gate electrodes ECL, GSL, WL1 to WLn, and SSL may be formed through a replacement process. For example, the sacrificial insulating layer ILD_SC is removed to form a recess exposing the insulating ring 125 and the pre-cell contact structure 150*p*. Subsequently, the gate electrodes ECL, GSL, WL1 to WLn, and SSL filling the recess are formed. The gate electrodes ECL, GSL, WL1 to WLn, and SSL may include, for example, tungsten (W), but are not limited thereto.

The gate electrode positioned at the uppermost end among the gate electrodes ECL, GSL, WL1 to WLn, and SSL disposed in a step shape may be in contact with the pre-cell contact structure 150*p*. For example, the side surface and the top surface of the gate electrode positioned at the uppermost end among the gate electrodes ECL, GSL, WL1 to WLn, and SSL disposed in the step shape may be in contact with the pre-cell contact structure 150*p*.

Figure 24:
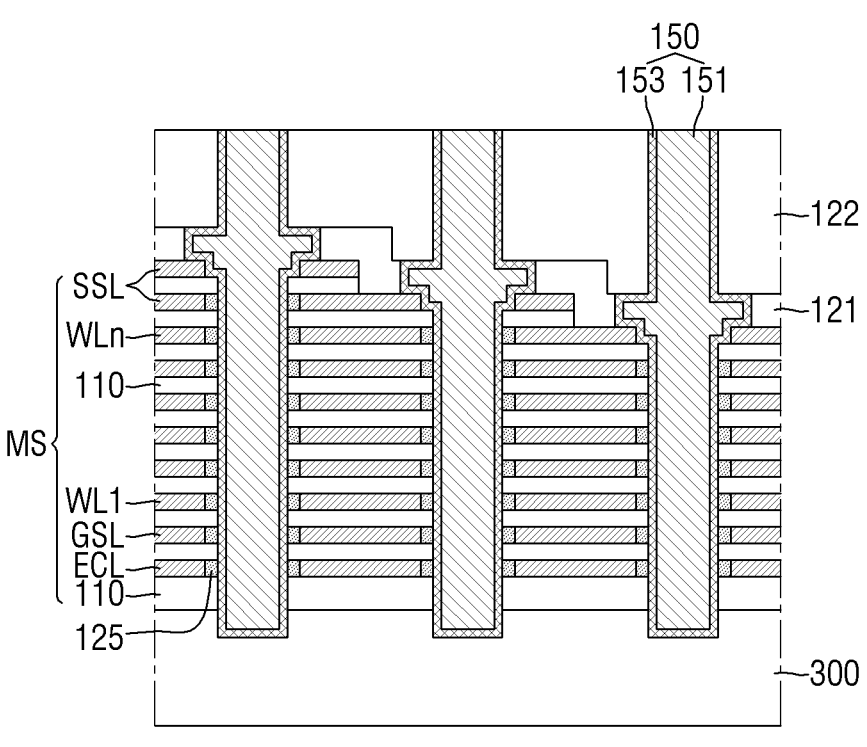

Referring to FIG. 24, a cell contact structure 150 may be formed. After the pre-cell contact structure 150*p* is removed, the cell contact structure 150 may be formed through a replacement process.

The cell contact structure 150 may be in contact with the gate electrode positioned at the uppermost end among the gate electrodes ECL, GSL, WL1 to WLn, and SSL disposed in the step shape. For example, the cell contact structure 150 may be in contact with the side surface and the top surface of the gate electrode positioned at the uppermost end among the gate electrodes ECL, GSL, WL1 to WLn, and SSL disposed in the step shape.

Since the cell contact structure 150 according to some example embodiments is in contact with the gate electrode on at least one or more surfaces, a non-volatile memory device having improved reliability may be manufactured.

The cell contact structure 150 may be formed as multiple layers including a barrier layer 153 and a filling layer 151, but is not limited thereto.

Hereinafter, an electronic system including the non-volatile memory device according to example embodiments will be described with reference to FIGS. 1 to 15 and FIGS. 25 to 27.

Figure 25:
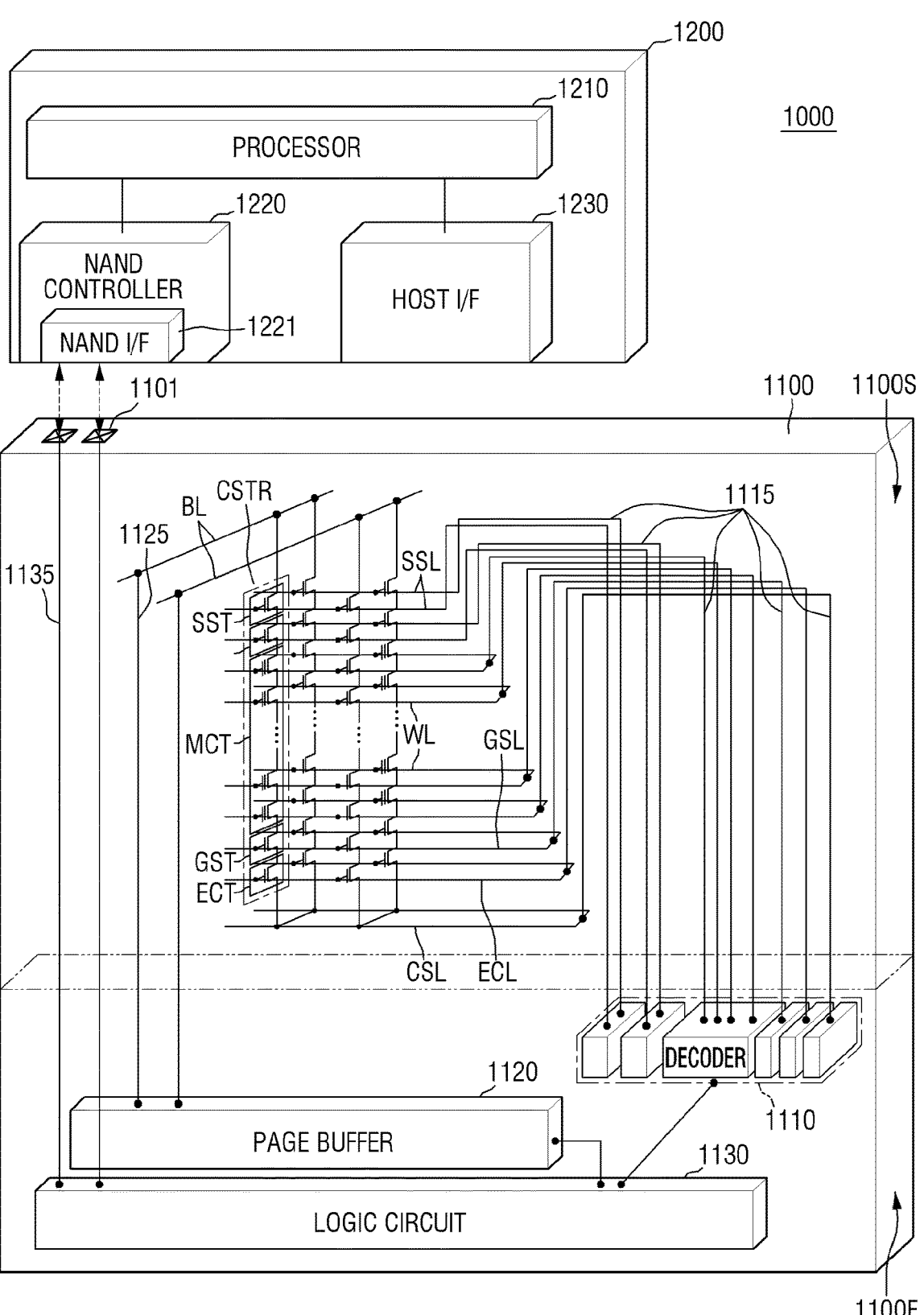
FIG. 25 is an illustrative block diagram for describing an electronic system according to some example embodiments.
Figure 26:
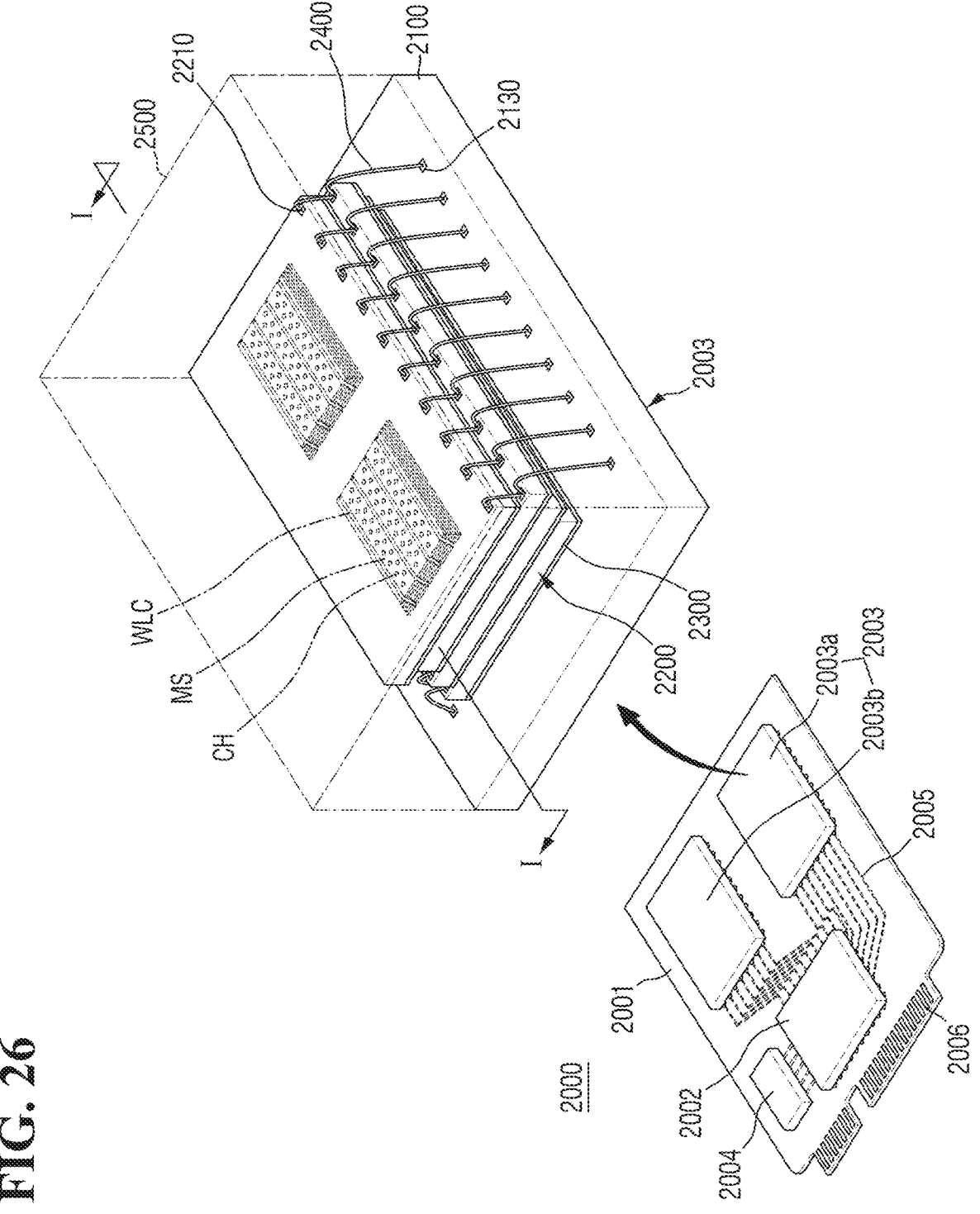
FIG. 26 is an illustrative perspective view for describing an electronic system according to some example embodiments.
Figure 27:
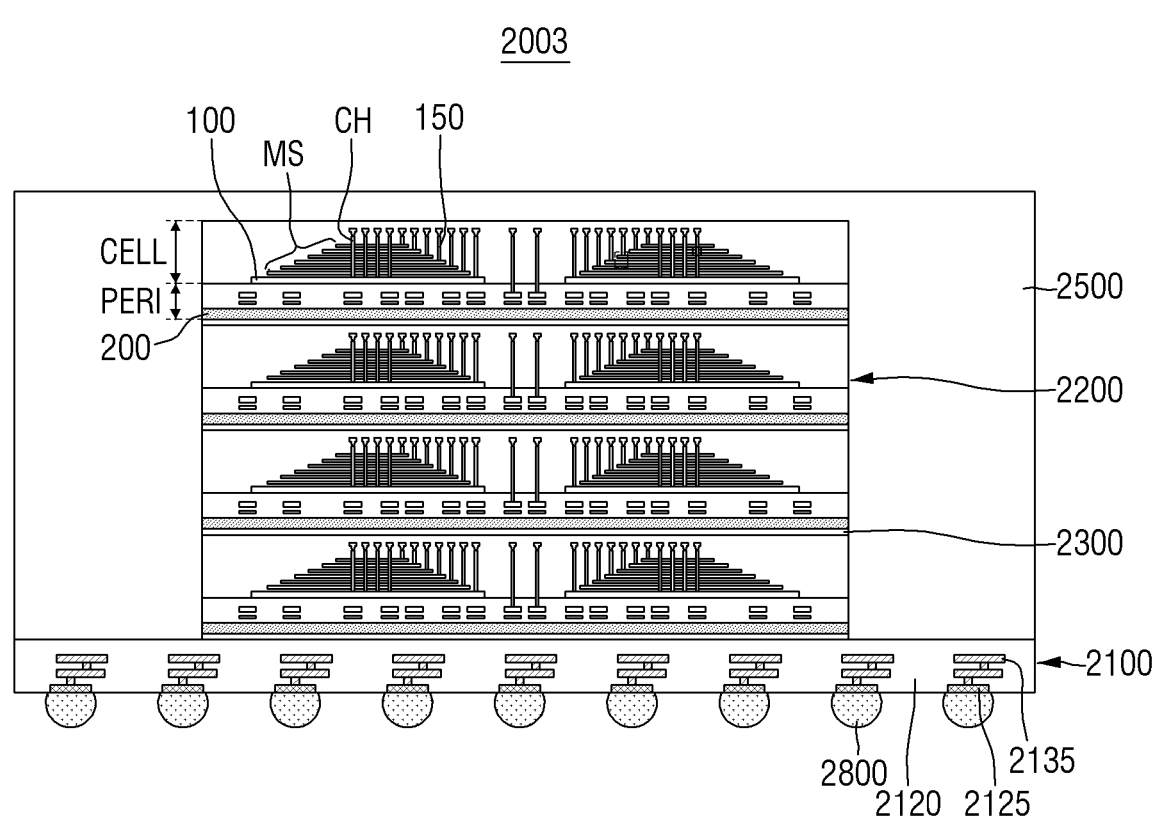
FIG. 27 is a schematic cross-sectional view taken along line I-I of FIG. 26.

FIG. 25 is an illustrative block diagram for describing an electronic system according to some example embodiments. FIG. 26 is an illustrative perspective view for describing an electronic system according to some example embodiments. FIG. 27 is a schematic cross-sectional view taken along line I-I of FIG. 26.

Referring to FIG. 25, an electronic system 1000 according to some example embodiments may include a non-volatile memory device 1100 and a controller 1200 electrically connected to the non-volatile memory device 1100. The electronic system 1000 may be a storage device including one non-volatile memory device 1100 or a plurality of non-volatile memory devices 1100 or an electronic device including the storage device. For example, the electronic system 1000 may be a solid state drive (SSD) device, a universal serial bus (USB), a computing system, a medical device, or a communication device including one non-volatile memory device 1100 or a plurality of non-volatile memory devices 1100.

The non-volatile memory device 1100 may be, for example, a NAND flash memory device, and may be, for example, the non-volatile memory device described above with reference to FIGS. 1 to 15. The non-volatile memory device 1100 may include a first structure 1100F and a second structure 1100S on the first structure 1100F.

The first structure 1100F may be a peripheral circuit structure including a decoder circuit 1110 (e.g., the row decoder 33 in FIG. 1), a page buffer 1120 (e.g., the page buffer 35 in FIG. 1), and a logic circuit 1130 (e.g., the control logic 37 in FIG. 1).

The second structure 1100S may include the common source line CSL, the plurality of bit lines BL, and the plurality of cell strings CSTR described above with reference to FIG. 2. The cell strings CSTR may be connected to the decoder circuit 1110 through the word line WL, at least one string select line SSL, and at least one ground select line GSL. In addition, the cell strings CSTR may be connected to the page buffer 1120 through the bit lines BL.

In some example embodiments, the common source line CSL and the cell strings CSTR may be electrically connected to the decoder circuit 1110 through first connection wirings 1115 extending from the first structure 1100F to the second structure 1100S.

In some example embodiments, the bit lines BL may be electrically connected to the page buffer 1120 through second connection wirings 1125 extending from the first structure 110F to the second structure 1100S.

The non-volatile memory device 1100 may communicate with the controller 1200 through an input/output pad 1101 electrically connected to the logic circuit 1130 (e.g., the control logic 37 in FIG. 1). The input/output pad 1101 may be electrically connected to the logic circuit 1130 through an input/output connection wiring 1135 extending from the first structure 1100F to the second structure 1100S.

The controller 1200 may include a processor 1210, a NAND controller 1220, and a host interface 1230. In some example embodiments, the electronic system 1000 may include a plurality of non-volatile memory devices 1100, and in this case, the controller 1200 may control the plurality of non-volatile memory devices 1100.

The processor 1210 may control an overall operation of the electronic system 1000 including the controller 1200. The processor 1210 may operate according to predetermined firmware, and may access the non-volatile memory device 1100 by controlling the NAND controller 1220. The NAND controller 1220 may include a NAND interface 1221 processing communication with the non-volatile memory device 1100. A control command for controlling the non-volatile memory device 1100, data to be written to the memory cell transistors MCT of the non-volatile memory device 1100, data to be read from the memory cell transistors MCT of the non-volatile memory device 1100, and the like, may be transmitted through the NAND interface 1221. The host interface 1230 may provide a communication function between the electronic system 1000 and an external host. When a control command is received from the external host through the host interface 1230, the processor 1210 may control the non-volatile memory device 1100 in response to the control command.

Referring to FIGS. 25 to 27, an electronic system according to some example embodiments may include a main board 2001, and a main controller 2002, one or more semiconductor packages 2003, and a dynamic random access memory (DRAM) 2004 that are mounted on the main board 2001. The semiconductor package 2003 and the DRAM 2004 may be connected to the main controller 2002 by wiring patterns 2005 formed on the main board 2001.

The main board 2001 may include a connector 2006 including a plurality of pins coupled to an external host. The number and arrangement of the plurality of pins in the connector 2006 may vary depending on a communication interface between an electronic system 2000 and the external host. In some example embodiments, the electronic system 2000 may communicate with the external host according to any one of interfaces such as universal serial bus (USB), peripheral component interconnect express (PCI-Express), serial advanced technology attachment (SATA), and M-Phy for universal flash storage (UFS). In some example embodiments, the electronic system 2000 may operate by power supplied from the external host through the connector 2006. The electronic system 2000 may further include a power management integrated circuit (PMIC) for distributing the power supplied from the external host to the main controller 2002 and the semiconductor package 2003.

The main controller 2002 may write data to or read data from the semiconductor package 2003, and may improve an operation speed of the electronic system 2000.

The DRAM 2004 may be a buffer memory for alleviating a speed difference between the semiconductor package 2003, which is a data storage space, and the external host. The DRAM 2004 included in the electronic system 2000 may operate as a kind of cache memory, and may also provide a space for temporarily storing data in a control operation for the semiconductor package 2003. When the electronic system 2000 includes the DRAM 2004, the main controller 2002 may further include a DRAM controller for controlling the DRAM 2004, in addition to a NAND controller for controlling the semiconductor package 2003.

The semiconductor package 2003 may include first and second semiconductor memory packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on lower surfaces of each of the semiconductor chips 2200, connection structures 2400 electrically connecting the semiconductor chips 2200 to the package substrate 2100, and a molding layer 2500 covering the semiconductor chips 2200 and the connection structures 2400 on the package substrate 2100.

The package substrate 2100 may be a printed circuit board including package upper pads 2130. Each semiconductor chip 2200 may include an input/output pad 2210. The input/output pad 2210 may correspond to the input/output pad 1101 of FIG. 25.

In some example embodiments, the connection structure 2400 may be a bonding wire electrically connecting the input/output pad 2210 to the package upper pads 2130. Accordingly, in each of the first and second semiconductor packages 2003a and 2003b, the semiconductor chips 2200 may be electrically connected to each other by a bonding wire method, and be electrically connected to the package upper pads 2130 of the package substrate 2100. In some example embodiments in each of the first and second semiconductor packages 2003a and 2003b, the semiconductor chips 2200 may also be electrically connected to each other by connection structures including through silicon vias (TSVs) instead of the bonding wire-type connection structures 2400.

In some example embodiments, the main controller 2002 and the semiconductor chips 2200 may also be included in one package. In some example embodiments, the main controller 2002 and the semiconductor chips 2200 may be mounted on a separate interposer substrate different from the main board 2001, and the main controller 2002 and the semiconductor chips 2200 may also be connected to each other by wirings formed on the interposer substrate.

In some example embodiments, the package substrate 2100 may be a printed circuit board. The package substrate 2100 may include a package substrate body part 2120, package upper pads 2130 disposed on an upper surface of the package substrate body part 2120, lower pads 2125 disposed on or exposed through a lower surface of the package substrate body part 2120, and internal wirings 2135 electrically connecting the package upper pads 2130 and the lower pads 2125 to each other in the package substrate body part 2120. The upper pads 2130 may be electrically connected to the connection structures 2400. The lower pads 2125 may be connected to the wiring patterns 2005 of the main board 2001 of the electronic system 2000 as illustrated in FIG. 26 through conductive connectors 2800.

Referring to FIGS. 26 and 27, in the electronic system according to some example embodiments, each of the semiconductor chips 2200 may include the non-volatile memory device described above with reference to FIGS. 1 to 15. For example, each of the semiconductor chips 2200 may include a peripheral circuit region PERI and a memory cell region CELL stacked on the peripheral circuit region PERI. For example, the peripheral circuit region PERI may include the peripheral circuit board 200 and the second wiring structures 241 and 242 described above with reference to FIGS. 3 to 8. In addition, for example, the memory cell region CELL may include the cell substrate 100, the mold structure MS, the channel structure CH, the block isolation region WLC, the bit line BL, and the cell contact structure 150 described above with reference to FIGS. 3 to 8.

In concluding the detailed description, those skilled in the art will appreciate that many variations and modifications may be made to the example embodiments without substantially departing from the principles of the present disclosure. Therefore, the disclosed example embodiments of the disclosure are used in a generic and descriptive sense only and not for purposes of limitation.

What is claimed is:

1. A non-volatile memory device comprising:
   a substrate comprising a cell array region and an extension region;
   a mold structure comprising a plurality of gate electrodes and a plurality of mold insulating layers alternately stacked on the substrate, wherein the mold structure has a step shape that steps downwardly in the extension region in a direction away from the cell array region;
   first and second interlayer insulating layers sequentially stacked on the mold structure;
   a channel structure penetrating through the mold structure in the cell array region; and
   a cell contact structure penetrating through the mold structure and the first interlayer insulating layer in the extension region,
   wherein the cell contact structure comprises a first portion in contact with a side surface of an uppermost one of the gate electrodes and a second portion in contact with a top surface of the uppermost one of the gate electrodes and a side surface of the first interlayer insulating layer,
   wherein a width of the first portion is smaller than a width of the second portion, and
   wherein an etch rate of the first interlayer insulating layer is greater than an etch rate of the second interlayer insulating layer.

2. The non-volatile memory device of claim 1, wherein the first portion of the cell contact structure overlaps the side surface of the uppermost one of the gate electrodes in a horizontal direction.

3. The non-volatile memory device of claim 1, further comprising an insulating ring between the cell contact structure and another one of the gate electrodes, wherein the insulating ring extends around the cell contact structure.

4. The non-volatile memory device of claim 3, wherein a width between outer sidewalls of the insulating ring is the same as the width of the first portion of the cell contact structure.

5. The non-volatile memory device of claim 3, wherein an outer sidewall of the insulating ring and a side surface of an adjacent one of the mold insulating layers are not co-planar.

6. The non-volatile memory device of claim 3, wherein a portion of the insulating ring is in contact with the first portion of the cell contact structure.

7. The non-volatile memory device of claim 1,
   wherein a vertical height of the first interlayer insulating layer is the same as a vertical height of the second portion of the cell contact structure.

8. The non-volatile memory device of claim 7, wherein the first interlayer insulating layer comprises silicon carbonate (SiOC).

9. The non-volatile memory device of claim 7, wherein the vertical height of the first interlayer insulating layer is greater than a vertical height of the uppermost one of the gate electrodes.

10. The non-volatile memory device of claim 1, further comprising a peripheral circuit configured to control an operation of the non-volatile memory device, and a wiring structure connected to the peripheral circuit,
   wherein the cell contact structure is connected to the wiring structure.

11. The non-volatile memory device of claim 1, further comprising metal oxide on the uppermost one of the gate electrodes, wherein the metal oxide is not between the uppermost one of the gate electrodes and the cell contact structure.

12. A non-volatile memory device comprising:
   a substrate comprising a cell array region and an extension region;
   a mold structure comprising a plurality of gate electrodes and a plurality of mold insulating layers alternately stacked on the substrate, wherein the mold structure has a step shape that steps downwardly in the extension region in a direction away from the cell array region;
   first and second interlayer insulating layers sequentially stacked on the mold structure;
   a channel structure penetrating through the mold structure in the cell array region;
   a cell contact structure penetrating through the mold structure and the first interlayer insulating layer in the extension region, wherein the cell contact structure is in contact with a side surface of an uppermost one of the gate electrodes, a top surface of the uppermost one of the gate electrodes, and a side surface of the first interlayer insulating layer; and
   an insulating ring between the cell contact structure and another one of the gate electrodes, wherein the insulating ring extends around the cell contact structure,
   wherein the cell contact structure comprises a first surface in contact with the side surface of the uppermost one of the gate electrodes and a second surface in contact with the side surface of the first interlayer insulating layer,
   wherein a width of the cell contact structure having the first surface in contact with the side surface of the uppermost one of the gate electrodes is smaller than a width of the cell contact structure having the second surface in contact with the side surface of the first interlayer insulating layer, and
   wherein an etch rate of the first interlayer insulating layer is greater than an etch rate of the second interlayer insulating layer.

13. The non-volatile memory device of claim 12, wherein a vertical height of the uppermost one of the gate electrodes is the same as a vertical height of at least one of the gate electrodes that is not in contact with the cell contact structure.

14. The non-volatile memory device of claim 12, wherein a width between outer sidewalls of the insulating ring is the same as the width of the cell contact structure having the first surface in contact with the side surface of the uppermost one of the gate electrodes.

15. The non-volatile memory device of claim 12, wherein a vertical height of the first interlayer insulating layer is greater than a vertical height of the uppermost one of the gate electrodes.

16. The non-volatile memory device of claim 12, wherein the cell contact structure includes a third surface in contact with the top surface of the uppermost one of the gate electrodes, and
   wherein the third surface extends from the first surface to the second surface.

17. The non-volatile memory device of claim 12, wherein the first interlayer insulating layer comprises silicon carbonate (SiOC), and
   wherein the second interlayer insulating layer comprises an oxide-based insulating material.

18. The non-volatile memory device of claim 12, further comprising metal oxide extending around the uppermost one of the gate electrodes,
   wherein the metal oxide is not between the uppermost one of the gate electrodes and the cell contact structure.

19. An electronic system comprising:

a main board;

a non-volatile memory device on the main board; and a controller electrically connected to the non-volatile memory device, wherein the non-volatile memory device comprises:

a substrate comprising a cell array region and an extension region;

a mold structure comprising a plurality of gate electrodes and a plurality of mold insulating layers alternately stacked on the substrate, wherein the mold structure has a step shape that steps downwardly in the extension region in a direction away from the cell array region;

first and second interlayer insulating layers sequentially stacked on the mold structure; a channel structure penetrating through the mold structure in the cell array region; and a cell contact structure penetrating through the mold structure and the first interlayer insulating layer in the extension region, wherein the cell contact structure comprises a first portion in contact with a side surface of an uppermost one of the gate electrodes and a second portion in contact with a top surface of the uppermost one of the gate electrodes and a side surface of the first interlayer insulating layer, wherein a width of the first portion is smaller than a width of the second portion, and wherein an etch rate of the first interlayer insulating layer is greater than an etch rate of the second interlayer insulating layer.

*   *   *   *   *